United States Patent [19]
Miyoshi

[11] Patent Number: 5,795,458
[45] Date of Patent: Aug. 18, 1998

[54] MANUFACTURING METHOD OF THIN FILM DIODE FOR LIQUID CRYSTAL DISPLAY DEVICE

[75] Inventor: Kozo Miyoshi, Kitamoto, Japan

[73] Assignee: Citizen Watch Co., Ltd., Tokyo, Japan

[21] Appl. No.: 528,215

[22] Filed: Sep. 13, 1995

[30] Foreign Application Priority Data

| Sep. 14, 1994 | [JP] | Japan | 6-219831 |
| Feb. 17, 1995 | [JP] | Japan | 7-028533 |
| Apr. 14, 1995 | [JP] | Japan | 7-088944 |

[51] Int. Cl.⁶ ............... C25D 11/02; G02F 1/1333
[52] U.S. Cl. ............... 205/124; 205/122; 205/192; 205/200; 216/24; 427/165
[58] Field of Search ............... 205/124, 123, 205/122, 171, 192, 200; 216/24; 427/164, 165, 166

[56] References Cited

U.S. PATENT DOCUMENTS

| 4,413,883 | 11/1983 | Baraff et al. | 250/334 |
| 4,704,559 | 11/1987 | Suginoya et al. | 315/169.1 |
| 5,485,294 | 1/1996 | Sugiyama et al. | 359/58 |

OTHER PUBLICATIONS

Japanese Abstract of JP 1-177391 A, Jul. 13, 1989.
Japanese Abstract of JP 58-178557 A, Oct. 19, 1983.
Japanese Abstract of JP 4-301097, Oct. 23, 1992.

*Primary Examiner*—Kathryn L. Gorgos
*Assistant Examiner*—William T. Leader
*Attorney, Agent, or Firm*—Armstrong, Westerman, Hattori, McLeland & Naughton

[57] ABSTRACT

A thin film diode (8) between a data line (12) and a drive electrode (13), which is free from breakage in an upper layer film (4), is formed on one inner surface of a glass substrate (1) sealing a liquid crystal of a liquid crystal display device. To form such a thin film diode, a lower layer film (2) is formed on the glass substrate (1) such that the lower layer film (2) overlaps with the upper layer film (4) and the lower layer film (2) has a plurality of differences in level. An insulating film (3) is formed by oxidizing the surface of the lower layer film (2) with an anodic oxidation technique. The upper layer film (4) is formed, thereby completing the thin film diode. Alternately, an insulating film material (7.7') may be formed either on the lower layer film (2) or on the peripheral region thereof in the form of a film, and the insulating film (3) may be formed by oxidizing the insulating film material (7.7').

13 Claims, 23 Drawing Sheets

MANUFACTURING METHOD OF THIN FILM DIODE FOR LIQUID CRYSTAL DISPLAY DEVICE

BACKGROUND OF THE INVENTION

1. Field of the Invention

The present invention relates to a manufacturing method for a thin film diode (TFD) in a liquid crystal display (LCD) device.

In the liquid crystal display device (LCD) having a structure where a liquid crystal is sealed between two glass substrates, to display a specified image by driving the liquid crystal, a thin film diode (TFD) serving as an active element (switching element) is arranged between a data line formed on an under glass substrate and each of the drive electrodes arranged in a dot matrix fashion. With such structure, interference between pixels can be prevented, thereby enhancing a quality of the displayed image. The present invention relates to a manufacturing method for such a thin film diode.

2. Description of the Prior Art

The structure of a liquid crystal display device to which the present invention is applied will be described with reference to FIGS. 1 to 3. First, with reference to FIG. 1, the total constitution of the color liquid crystal display will be described.

In FIG. 1, reference numeral 1 denotes a lower glass substrate, and reference numeral 11 denotes an upper glass substrate. A stripe-shaped data line 12 and a plurality of drive electrodes 13 arranged in a dot matrix fashion are formed on the lower glass substrate 1. A thin film diode (TFD) 8 serving as an active element (switching element) is disposed between the data line 12 and each of the drive electrodes 13.

An orienting film 15 made of a polyimide resin film to orient liquid crystals is disposed on the data line 12, the drive electrodes 13, and the thin film diode 8.

On the other hand, a color filter 17 composed of color filter elements is disposed under the surface of the upper glass substrate 11. A black matrix 16 is formed in the boundary regions of the color filter elements. The red (R), green (G), and blue (B) color filter elements are arranged so as to correspond to each of the drive electrodes 13 on the glass substrate 1, respectively.

A stripe-shaped scanning electrode (not shown) is disposed under the surface of the color filter 17 interposing an insulating film (not shown). The scanning electrode is in a perpendicular to the data line 12. Further, an orienting film 18 made of a polyimide film serving for orienting the liquid crystal is disposed on the scanning electrode.

A liquid crystal (not shown) is sealed between the orientating films 15 and 18. Further, polarizing plates 19 and 20 are arranged on each outer surface of the lower and upper glass substrate 1 and 11 respectively so that the polarized axises thereof are perpendicular to each other. In the liquid crystal display device described above, if the color filter 17 is omitted, the liquid crystal display device functions as a black/white liquid crystal display device.

Next, referring to FIG. 2 and FIG. 3, a structure of the thin film diode 8 incorporated in the liquid crystal display device of the present invention will be described.

FIG. 3 is a sectional view taken along the line III—III shown in a plan view of FIG. 2.

The thin film diode 8 has a Metal-Insulator-Metal structure composed of a lower layer film 2 protruding from the data line 12, an insulating film 3 formed on the surface of the film 2, and an upper layer film 4 formed on the film 3.

The upper layer film (electrode) (hereinafter referred to as upper layer film) 4 serves as a part of the drive electrode 13.

Specifically, a punched portion 13a is formed in the drive electrode 13 close to the portion thereof which crosses the lower layer film (electrode)(hereinafter referred to as lower layer film) 2, so that the thin film diode 8 presents a plan view pattern in which the lower and upper layer films 2 and 4 cross.

A manufacturing method of the thin film diode 8 will be briefly described below.

A tantalum (Ta) film as a material for the data line 12 and the lower layer film 2 is formed on the glass substrate 1. The tantalum (Ta) film is patterned by means of a photo-etching processing. Thereafter, an anodic oxidation processing is carried out using the patterned tantalum (Ta) film as an anode to form the insulating film 3 made of a tantalum pentoside ($Ta_2 O_5$) on the tantalum (Ta) film. This anodic oxidation processing is performed in such a manner that citric acid, the tantalum film, and platinum (Pt) are used as an anodic oxidation liquid, an anode, and a cathode, respectively, and a direct current is applied between the tantalum film and platinum.

Thereafter, indium-tin-oxide (ITO) film serving as a material for the drive electrode 13 and the upper layer film 4 is formed on the entire surface. Then, the indium oxide tin film is subjected to patterning by means of a photo-etching processing so that the upper layer film 4 and the drive electrode 13 are formed.

The conventional constitution and manufacturing method thereof of a thin film diode 8 in such a liquid crystal display device will be further described with reference to FIGS. 4 to 7.

The vertical sectional view of the lower layer film 2 constituting the thin film diode on the glass substrate 1 presents either a rectangular shape as shown in FIG. 4 or a tapered-trapezoidal shape as shown in FIG. 5.

The reason why it presents such the shape is that patterning of the film 2 is ordinarily carried out by one etching process.

Specifically, in a manufacturing method for such a thin film diode, the substance for the lower layer film is initially formed on the upper surface of the glass substrate 1 by either a sputtering technique or a chemical vapor deposition technique. Subsequently, a resist pattern is formed on the substance for the lower layer film by using a lithography technique.

Thereafter, an etching processing by means of either a wet etching technique or a dry etching technique is carried out using the patterned resist as a mask to form a pattern of the lower layer film 2 as shown in FIG. 4 or FIG. 5.

When etching the lower layer film, it is difficult to control the etching shape by the wet etching technique. However, with the dry etching technique, it is possible to produce the tapered-trapezoidal shape shown in FIG. 5 by controlling an etching speed ratio of the resist to the substance for the lower layer film.

Subsequently, as shown in FIG. 6 or FIG. 7, an anodic oxidation process using the lower layer film 2 as an anode is performed to form the insulating film 3 on the surface of the film 2.

Further, a substance for the upper layer film is formed on the insulating film 3 by either the sputtering technique or the chemical vapor deposition technique. Thereafter, a resist pattern (not shown) is formed on the substance for the upper layer film by the lithography technique.

Following the above processes, an etching process to form the pattern of the upper layer film 4 is carried out by either the wet etching technique or the dry etching technique using the patterned resist as a mask. As a result, the thin film diode 8 of the Metal-Insulator-Metal structure is completed.

At the time of the formation of the thin film diode, it is essential to form a region where the lower and upper layer films 2 and 4 overlap each other. The upper layer film 4 overlapping with the lower layer film 2 sometimes breaks at its step portion. The situation of the breaking of the film 4 will be described with reference to FIGS. 6 and 7.

Referring to FIG. 6, the region where the upper layer film 4 is formed stretches over the glass substrate 1 and the insulating film 3.

Therefore, the film property of the film 4 on the insulating film 3 is different from that on the glass substrate 1 due to the difference of the materials of the substrate 1 and the film 3. Specifically, the boundary due to the difference of the film natures is produced between the glass substrate 1 and the insulating film 3. Further, a growth direction of the covering film serving as the upper layer film 4 on the etched side region of the glass substrate 1 is different from that thereof on the etched side region of the lower layer film 2. As a result, both growth directions meet with each other at the boundary so that a crystallinity of the film 4 is deteriorated at the boundary.

Therefore, the crystallinity of the covering film serving as the upper layer film 4 is deteriorated in addition to the difference of the film property at the boundary region (shown by the arrow A) between the glass substrate 1 and the insulating film 4. Thus, the portion of the covering film at the boundary region is more liable to break than other portions thereof. The occurrence of such breaking of the film produces a defective pixel, leading to a decrease in a quality of the liquid crystal display device.

Especially, when the surface of the lower layer film 2 is oxidized by the anodic oxidizing technique to form the insulating film 3 and the patterned upper layer film 4 formed on the film 3, the film 3 is formed only on the surface of the lower layer film 2. Thus, the upper layer film 4 is formed stretching over the glass substrate 1 and the insulating film 3 which have different natures. This causes severe problems.

Moreover, the insulating film 3 grows isotopically during the formation thereof using the anodic oxidation technique. Accordingly, though the section of the lower layer film 2 formed on the glass substrate 1 is made into a taper-shaped trapezoid by etching as shown in FIG. 5, the section of the insulating film 3 presents the shape shown in FIG. 7. The portion of the insulating film 3 at the boundary between the glass substrate 1 and the film 3 does not present the tapered shape so that the effects of the tapered shape is decreased. For this reason, the portion of the upper layer film 4 at the boundary (shown with an arrow B) between the glass substrate 1 and the insulating film 3 is also apt to be broken.

SUMMARY OF THE INVENTION

The object of the present invention is to reduce the breaking of an upper layer film constituting a thin film diode in order to increase the quality of display of a liquid crystal display device serving as an active element incorporated in the liquid crystal display device.

To achieve the above object of the present invention, the present invention provides the following manufacturing method for the thin film diode of the liquid crystal display device.

Specifically, a film of a lower layer film material is formed on a glass substrate, and a resist pattern is formed on the upper layer film material by a photo-lithography technique.

The lower layer film material is subjected to an etching process using the pattern of the resist as an etching mask to form a pattern of the lower layer film, thereafter, the dimension of the resist pattern is lessened.

The exposed portion of the lower layer film is etched using the lessened pattern of the resist as an etching mask until the thickness of the film is reduced to a predetermined value. Thus, the lower layer film has a difference in level which overlaps with an upper layer film in a thickness direction.

Thereafter, an insulating film is formed on the surface of the lower layer film by an anodic oxidation process, and then the upper layer film is formed on the insulating film.

Further, after the pattern of the lower layer film is formed in a similar manner to the above process, the resist is peeled off. An insulating film material is formed on the pattern of the lower layer film. This insulating film material is subjected to an anodic oxidation process to form an insulating film. Or, the insulating film material may be oxidized together with a lower layer film. Thereafter, the upper layer film may be formed on the lower layer film.

The insulating film material may be either the same material as that of the lower layer film material or a different material from that of the lower layer film, as long as it is a material that the insulating film can be formed from by the anodic oxidation process. For example, tantalum (Ta) or aluminum (Al) may be used.

The following manufacturing method may be adopted as another manufacturing method. Specifically, the pattern of a resist having a different pattern dimension from that of the resist used for the etching of the lower layer film is formed on the insulating film material formed in the form of a film. The insulating film material is patterned by etching the material using this resist as an etching mask. The patterned insulating film material or the exposed portion of the lower layer film from the insulating film material is oxidized by the anodic oxidation process, thereby forming the insulating film having the difference in level around the lower layer film.

The following manufacturing method may be employed as another manufacturing method. Specifically, after the insulating film and the anodic unoxidized portion are formed by oxidizing the insulating film material formed in the form of the film with the anodic oxidation technique, the pattern of the upper layer film is formed on the insulating film located on the lower layer film. The etching process for the insulating film and the anodic unoxidized portion can be performed by using the pattern of the upper layer film as an etching mask.

Alternatively, the pattern of the resist having the larger pattern dimension than that of the upper layer film is formed thereon, and the etching processing for the insulating layer film and the anodic unoxidized portion may be performed using the pattern of the resist.

Further, a protection film is additionally formed on the pattern of the upper layer film, and the etching processing for the insulating film and the anodic unoxidized portion can be performed using the pattern of the protection film.

Further, there is also the following manufacturing method for the thin film diode of the present invention.

A lower layer film material is formed on a glass substrate in the form of a film. The pattern of a resist is formed on the lower layer film by a photo-lithography technique. The lower layer film is etched using the pattern of the resist as an etching mask until the thickness of the lower layer film is reduced to a predetermined value in a thickness direction.

Thereafter, the pattern dimension of the resist is changed. The lower layer film material is further etched using the pattern of the resist, thereby forming the lower layer having a difference in level in the direction of overlapping of the upper layer film with the lower layer film.

An insulating film is formed on the surface of the lower layer film by anodic oxidation processing, and the lower layer film is formed on the insulating film.

After etching the lower layer film material formed in the form of the film in the direction of the film thickness, the resist used for the etching mask is peeled off, the lower layer film material is oxidized by the anodic oxidation technique to form the insulation film. The lower layer film is patterned.

Further, there is another manufacturing method for the thin film diode of the present invention following.

A lower layer film material is formed on a glass substrate. The pattern of a resist is formed on the lower layer film material by a photo-lithography technique. The lower layer film material is etched using the pattern of the resist as an etching mask to form the pattern of the lower layer film.

Thereafter, a film of an insulating film material is formed on the glass substrate and the resist. The film of the insulating film material formed on the resist is removed, as well as the resist.

The surfaces of the insulating film material formed on the glass substrate and the lower layer film are oxidized by an anodic oxidation technique to form an insulating film. An upper layer film is formed on the insulating film.

When the thin film diode incorporated in the liquid crystal display device is manufactured using these manufacturing methods, the overlapping area of the upper layer film with the lower layer film is larger than that of the thin film diode of the conventional embodiment, and the differences of the film qualities between the insulating film of an element region of the thin film diode and that of the vicinity thereof are not caused. For this reason, elements with defects due to breaks at the differences in level are greatly reduced so that the display quality of the liquid crystal display device can be remarkably enhanced.

DETAILED DESCRIPTION OF THE PREFERRED EMBODIMENTS

A variety of embodiments of a thin film diode incorporated in a liquid crystal device according to the present invention will be sequentially described with reference to the accompanying drawings.

Firstly, the structure of the thin film diode manufactured by manufacturing methods of the present invention will be described with reference to FIGS. 8 and 9.

Figure 1:
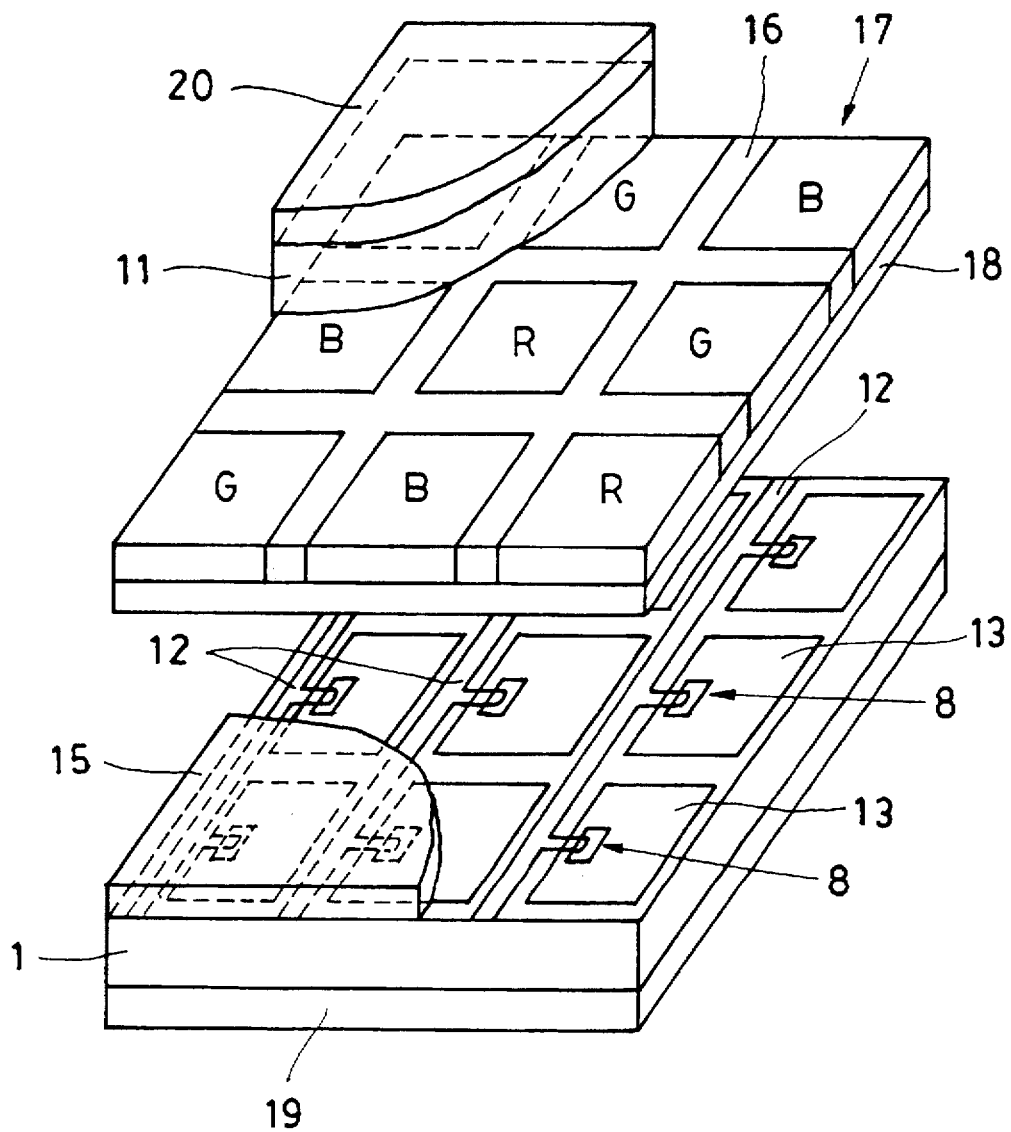
FIG. 1 is an exploded perspective view showing partially a liquid crystal display device to which the present invention is applied.
Figure 2:
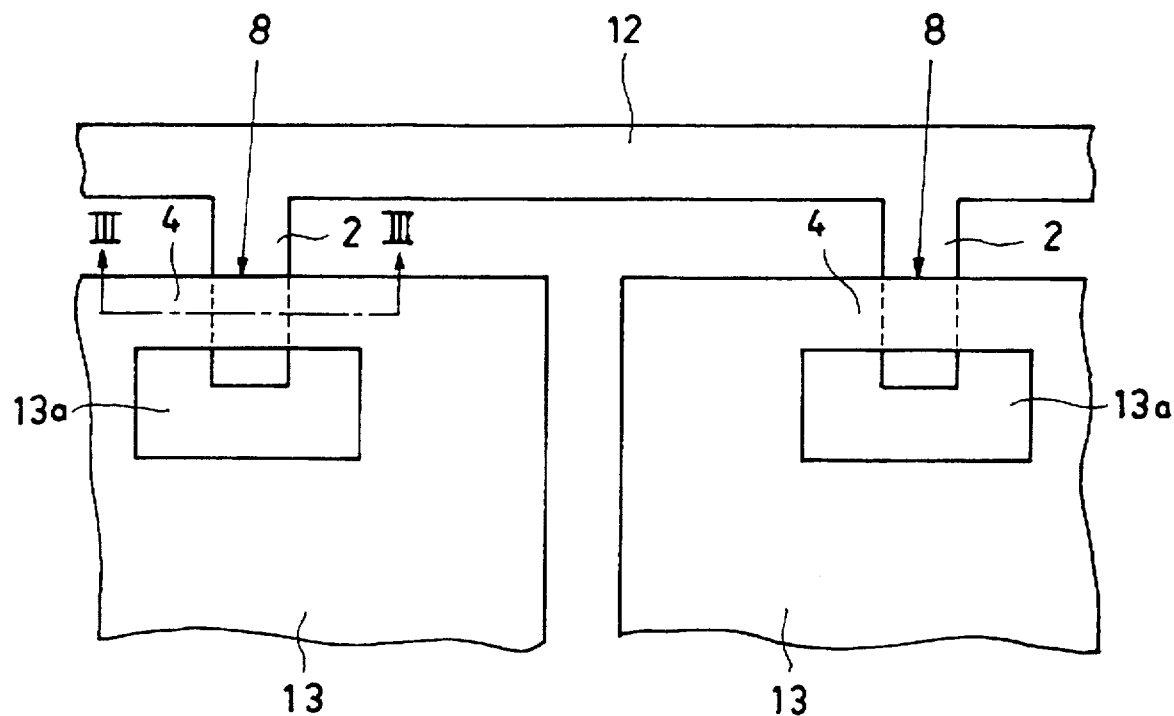
FIG. 2 is a plan view showing a constitution of a thin film diode of the present invention.
Figure 3:
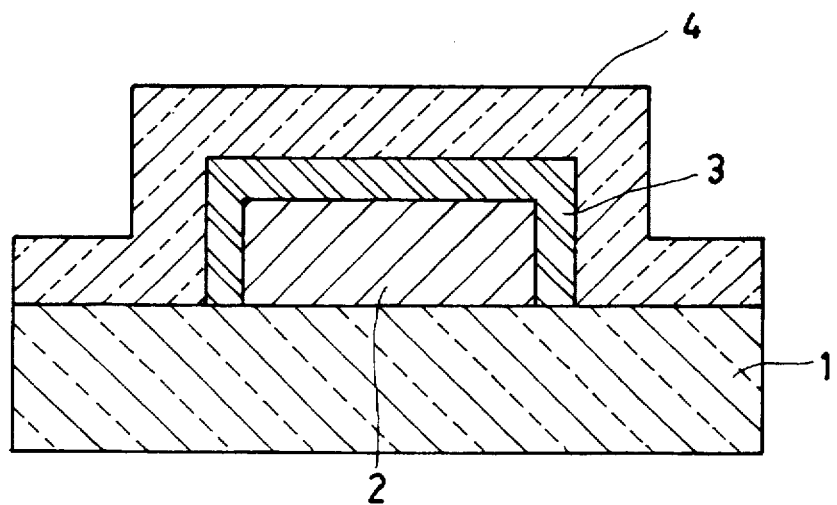
FIG. 3 is a sectional view taken along the line III—III in FIG. 2.
Figure 4:
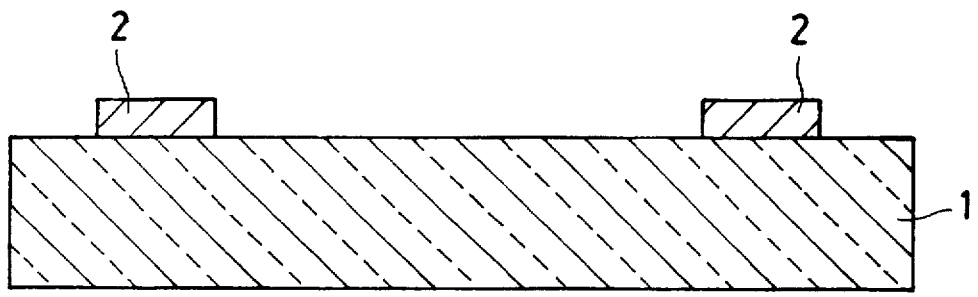
FIGS. 4 and 5 are sectional views showing a vertical section of a lower layer film formed on a glass substrate at the time of manufacturing of a conventional thin film diode.
Figure 5:
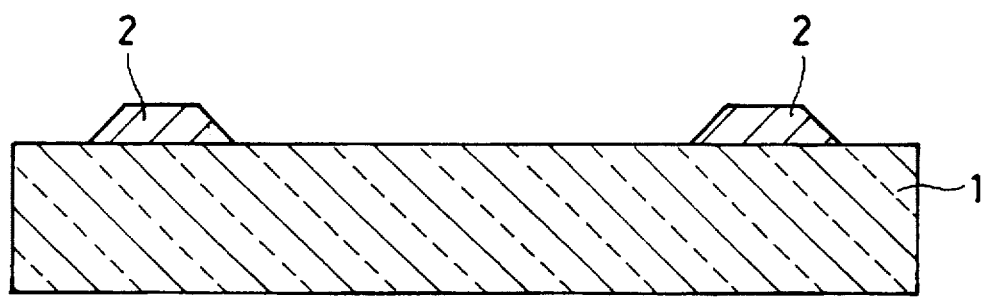
Figure 6:
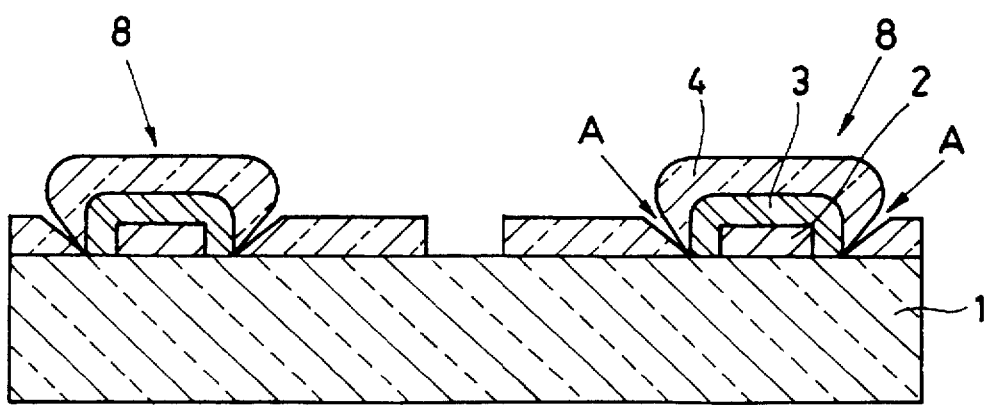
FIGS. 6 and 7 are vertical sectional views showing a constitution of the conventional thin film diode manufactured using the lower layer film of FIGS. 4 and 5, respectively.
Figure 7:
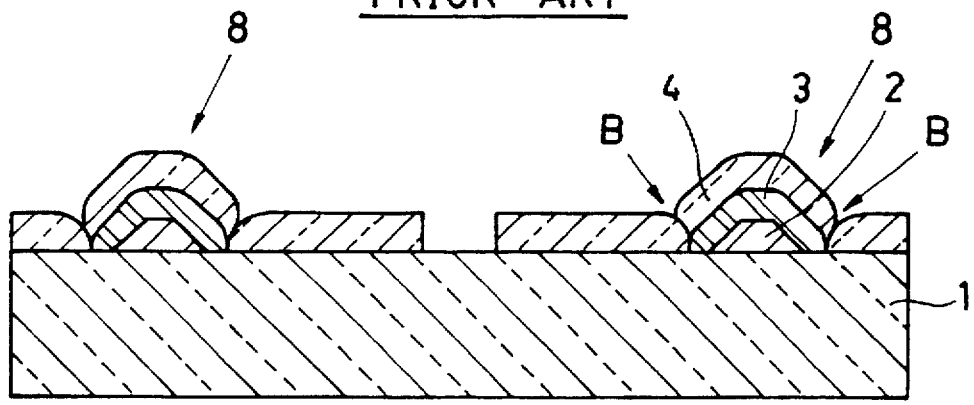
Figure 8:
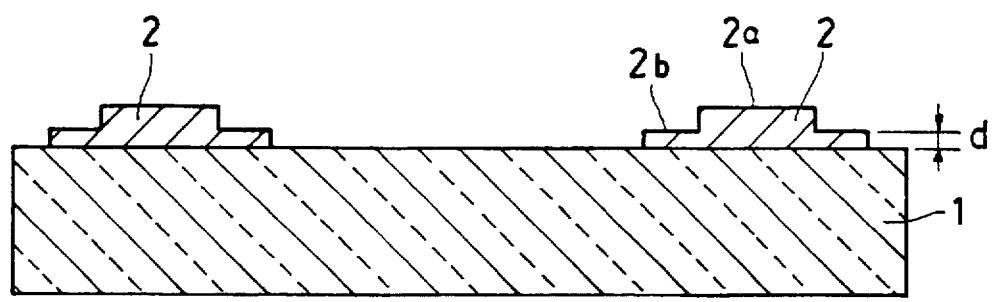
FIG. 8 is a sectional view showing an example of a lower layer film formed on a glass substrate at the time of manufacturing a thin film diode of the present invention.

As shown in FIG. 8, a lower layer film 2 formed on a glass substrate 1 comprises a higher step portion 2a and a lower step portion 2b, and its vertical section presents a level difference at least in a direction of an upper layer film's overlapping with the lower layer film. An insulating film 3 is formed by oxidizing the surface of the lower layer film 2 using an anodic oxidation technique. An upper layer film 4 is formed on the insulating film 3. Thus, an element of a thin film diode (TFD) 8 having the structure shown in FIG. 9 is obtained.

In this embodiment, the lower step 2b of the lower layer film 2 having a thickness d is entirely converted to the insulating film 3 when the surface of the lower layer film 2 is oxidized by the anodic oxidizing technique. The portion of the insulating film 3 in the vicinity of the boundary between the glass substrate 1 and the lower layer film 2 is thicker than the conventional lower layer film by the thickness d of the lower step portion 2b. Although this causes a decrease in the height and width of the higher step 2a, the unoxidized portion remains as the lower layer film 2. Therefore, the insulating film 3 is formed stretching over the surface of the residual lower layer film 2 and the glass substrate 1, exhibiting the step shown in FIG. 9.

As described above, since the insulating film 3 has the step, the upper layer film 4 formed stretching over the glass substrate 1 and the lower layer film 2 has two step portions. Therefore, the difference in level for each step is decreased to half. A load for each step portion is decreased, thereby being able to decrease breaks at the step portion.

In the above embodiment, the vertical section of the lower layer film 2 before the formation of the insulating film 3 by the anodic oxidation of the lower layer film 2 presents two step portions. As a matter of course, the number of the step portions may be three or more.

Figure 10:
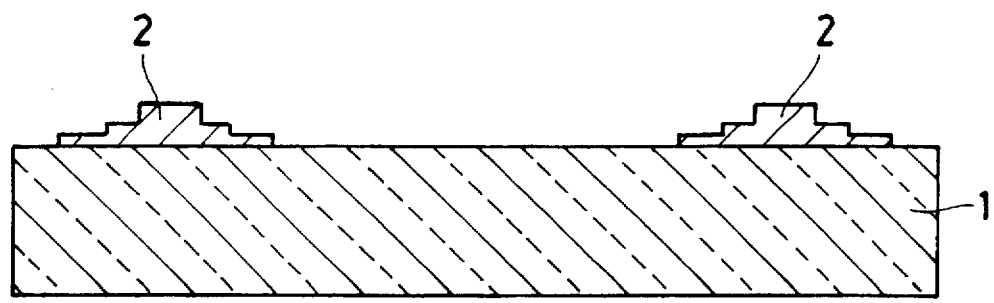
FIGS. 10, 12, and 14 are sectional views showing different examples of the vertical sections of the lower layer film formed at the time of manufacturing the thin film diode of the present invention.
Figure 11:
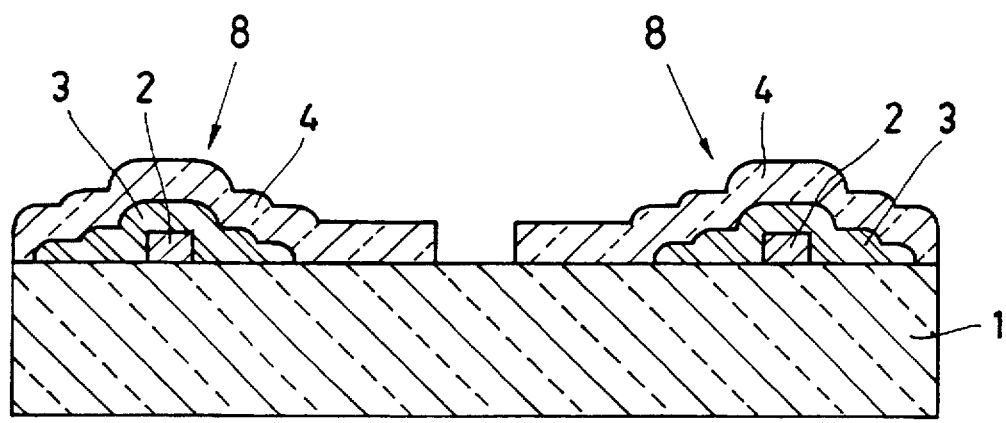
FIGS. 11, 13, and 15 are vertical sectional views showing constitutions of the thin film diodes manufactured using the lower layer films of FIGS. 10, 12, and 14.

Referring to FIG. 10, when forming the thin film diode 8 using the lower layer film 2 having three step portions, the structure shown in FIG. 11 is obtained. In this case, the surface of the insulating film 3 is oxidized by the thickness equal to that of the two step portions shown in FIG. 10, by oxidizing the surface of the lower layer film 2 using the anodic oxidation technique.

Figure 12:
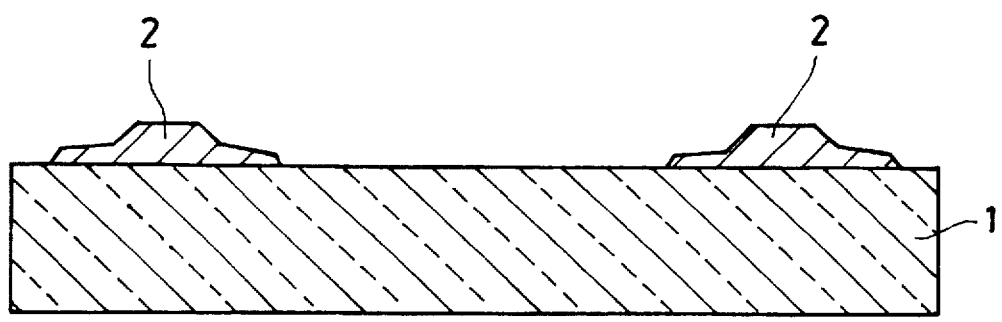

Further, the vertical section of the lower layer film 2 before the formation of the insulating film 3 may be a tapered trapezoid having two tapered step portions as shown in FIG. 12.

Figure 13:
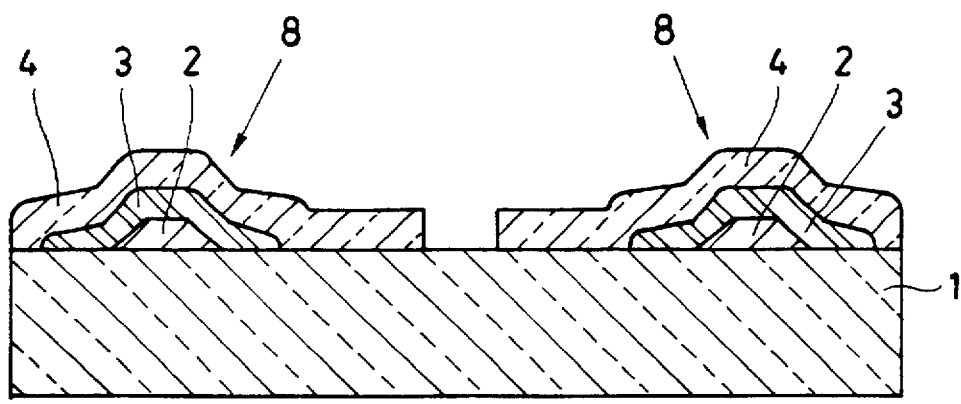

The formation of the thin film diode 8 using the lower layer film 2 of the vertical section shown in FIG. 12 produces the structure as shown in FIG. 13.

Figure 14:
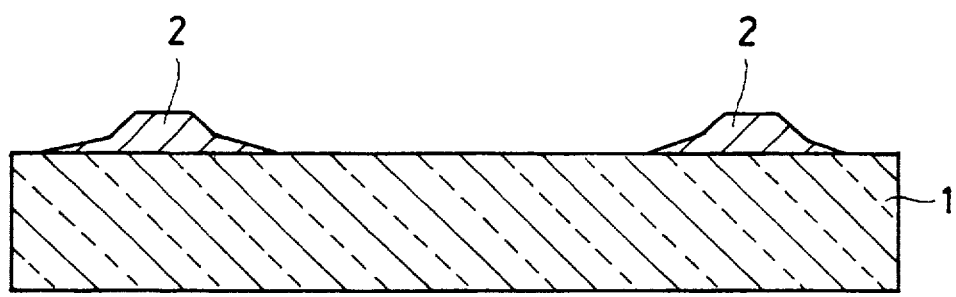

Moreover, the vertical section of the lower layer film 2 before the formation of the insulating film 3 may be a trapezoid having such lower and upper tapered step portions that the taper angle of the lower tapered step portion near the glass substrate 1 is very small and the taper angle of the upper tapered step portion is larger than that of the lower tapered step portion as shown in FIG. 14.

Figure 15:
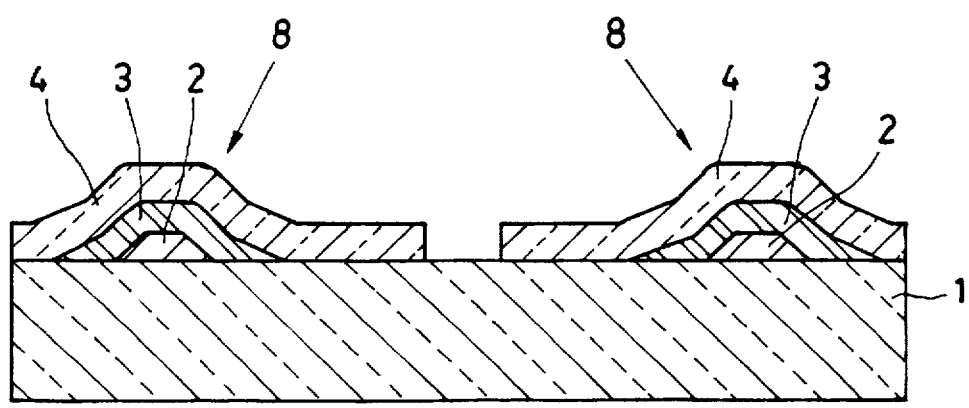

The formation of the thin film diode 8 using the lower layer film 2 of the vertical section shown in FIG. 14 produces the structure as shown in FIG. 15. By using the lower layer film 2 shown in FIG. 14, the accuracy of patterning the films 3 and 4 is not decreased and the taper angle of the upper layer film 4 will be substantially equal to that of the lower layer film 2.

Next, the manufacturing method of the thin film diode of the present invention will be described for forming the thin film diode on the glass substrate of the liquid crystal display device.

The embodiment in which tantalum (Ta) for the lower layer film 2 and indium-tin-oxide (ITO) for the upper layer film 4 are used will be described.

[ A first manufacturing method ]

A first manufacturing method of the thin film diode of the present invention will be described.

Figure 16:
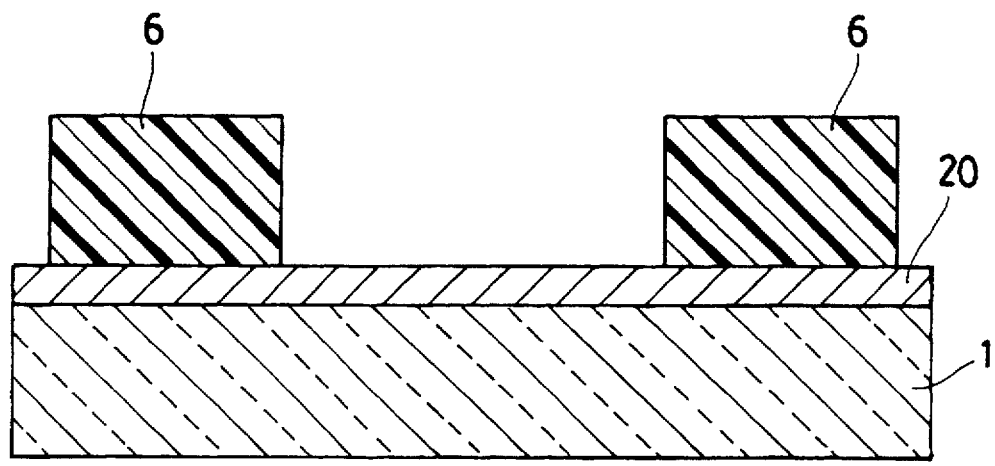
FIGS. 16 to 64 are sectional views of the glass substrate and the thin film diode forming portion showing the different steps for explaining various kinds of manufacturing methods of the thin film diode of the present invention.

First, as shown in FIG. 16, a tantalum film 20 of 50 nm to 500 nm thickness for the lower layer film material is formed on the glass substrate 1 by a sputtering technique. Subsequently, the patterned resist 6 of the same pattern as the tantalum film 20 is formed on the tantalum film 20 by the photo-lithography technique.

The formation of the tantalum film 20 is performed under the following conditions. Specifically, argon gas of flow rate 100 sccm is conducted into a sputtering device, and the pressure at the device is regulated at the pressure 5 mTorr. Radio frequency (RF) electrical power (oscillation frequency: 13.56 MHz) of 1 KW to 3 KW is applied to generate plasma. Tantalum as a target material is sputtered by the plasma. The sputtered tantalum is deposited on the glass substrate 1.

Figure 17:
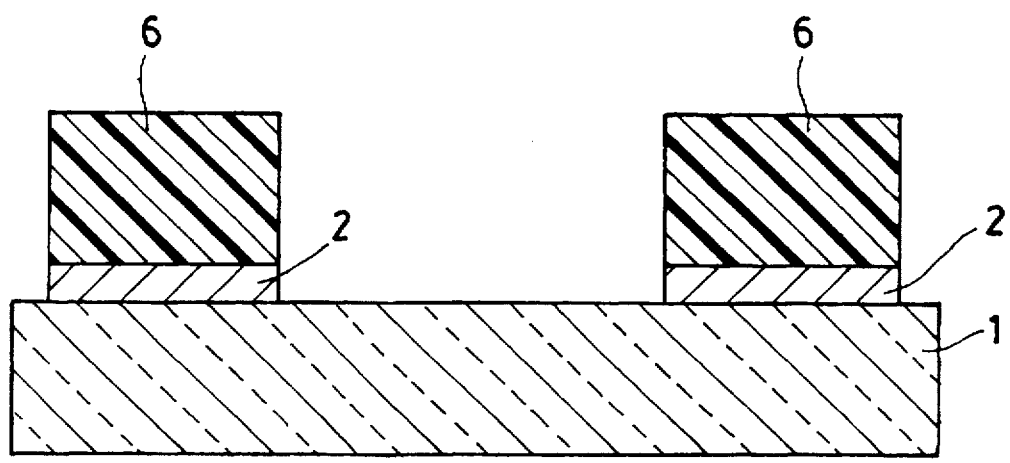

Using the patterned resist 6 as a mask, the tantalum film 20 is subjected to either the dry etching process or the wet etching process to form a pattern of the lower layer film 2 as shown in FIG. 17.

When the tantalum film 20 is etched by the dry etching process, sulfur hexafluoride (SF6) of flow rate 100 to 500 sccm is conducted into a dry etching device, and oxygen of flow rate 0 to 100 sccm is added to the sulfur hexafluoride (SF6). Thus, a total pressure of 50 to 200 mTorr at the dry etching device is produced. Radio frequency electrical power (oscillation frequency: 13.56 MHz) of 100 to 1000 W is applied thereto. Plasma is generated. The dry etching is performed with this plasma.

When the tantalum film 20 is etched by the wet etching process, the process is carried out by using a solution prepared by mixing sulfur hexafluoride, nitric acid, ammonium fluoride, and water in a ratio of 5:2:1:3.

Figure 18:
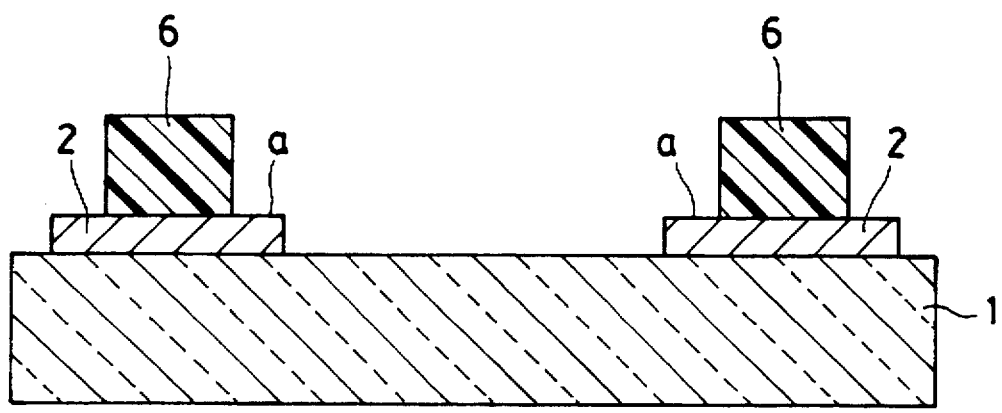

Thereafter, ashing process for the resist 6 on the lower layer film 2 is performed to reduce the pattern dimension of the resist 6 as shown in FIG. 18.

This ashing process is performed by plasma produced in the following way. Oxygen of a flow rate 100 to 1000 sccm is conducted into the dry etching device, and sulfur hexafluoride of a flow rate 0 to 100 sccm is added. The total pressure at the device is regulated at 100 to 300 mTorr. Radio frequency electrical power (oscillation frequency: 13.56 MHz) of 100 to 500 W is applied thereto. Thus, plasma is generated under the above conditions.

At the time of the ashing, etching of the lower layer film 2 which is the tantalum film slightly proceeds by regulating the quantity of sulfur hexafluoride, and the exposed portion a that is not covered with the resist 6 by the ashing process may be made a tapered-shape.

Figure 19:
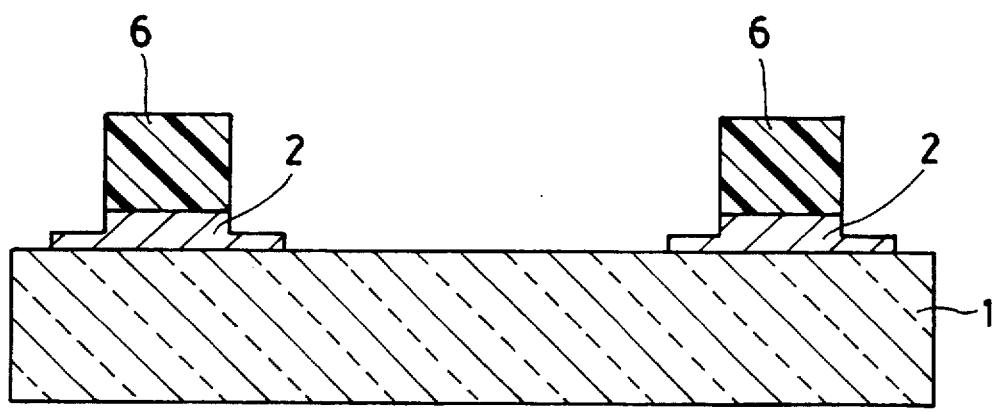

Next, as shown in FIG. 18, using the resist 6 of the reduced pattern dimension as a mask, either the dry etching process or the wet etching process for the lower layer film 2 is carried out. The etching process proceeds in the direction of the film thickness and is stopped at midway, thereby forming the step portion in the lower layer film 2 as shown in FIG. 19.

The resist 6 on the lower layer film 2 is peeled off, thereby obtaining the lower layer film 2, the vertical section of which has a step portion as shown in FIG. 8.

Thereafter, the surface of the lower layer film 2 is oxidized by anodic oxidation so that the insulation film 3 is formed. The patterned upper layer film 4 is formed thereon. As a result, the thin film diode 8 of the structure shown in FIG. 9, where the breaking of the upper layer film 4 is not caused, can be manufactured on the glass substrate 1.

This anodic oxidation process is performed as follows. Using citric acid solution of concentration 0.01 to 1%, a voltage of 10 to 100 V is applied between tantalum (Ta), as a material for the lower layer film 2, and a platinum electrode as a cathode.

Further, by performing the ashing process and the etching process once again, the lower layer film 2 of the vertical section having the step portions can be formed as shown in FIG. 10.

Still further, at the time of the etching process and the ashing process, by controlling the etching rate ratio of the resist 6 to the tantalum film 20 as a material for the lower layer film 2, the lower layer film 2 having the tapered-shaped vertical section can be formed as shown in FIGS. 12 and 14.

[ Second Manufacturing Method ]

A manufacturing method different from the foregoing manufacturing method for the thin film diode will be described.

Also in this manufacturing method, as shown in FIG. 16, the tantalum film 20 as the lower layer film is formed on the glass substrate 1 by the sputtering technique. The resist 6 is formed on the tantalum film 20 and is patterned by the photo-lithography technique. Subsequently, either the dry etching process or the wet etching process for the tantalum film 20 is performed using the resist 6 as a mask. The above steps until the formation of the patterned tantalum film 20 are the same as those of the first manufacturing method.

Next, the resist 6 on the lower layer film 2 shown in FIG. 17 is peeled off.

As shown in FIG. 18, a patterned resist 6 (the same reference numeral is used as that of FIG. 17 for simplicity of explanation) is again formed on the lower layer film 2 using the photo-lithography. The pattern dimension of the resist 6 of FIG. 18 is smaller than that of FIG. 17.

Subsequently, either the dry etching technique or the wet etching technique for the lower layer film 2 is performed using the resist 6 having a small pattern dimension. As shown in FIG. 19, the etching process is stopped when the film 2 is etched to the predetermined thickness. As a result, the step portion of the film 2 is formed.

Figure 9:
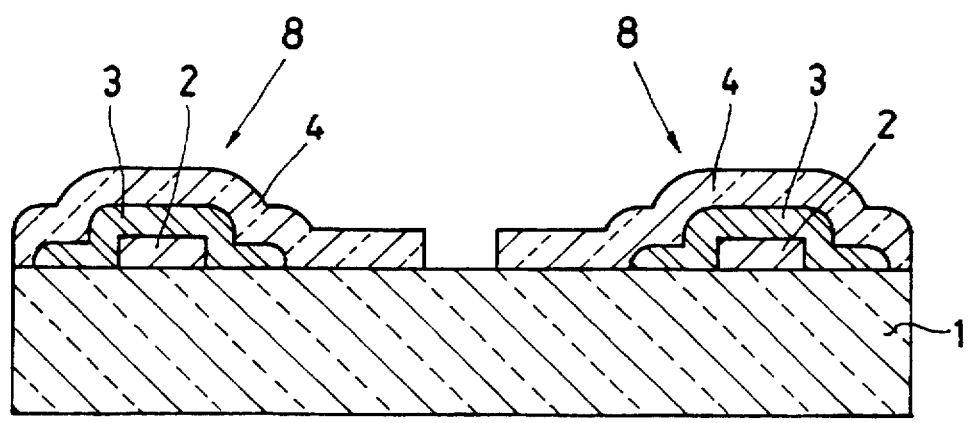
FIG. 9 is a vertical sectional view showing a constitution of the thin film diode manufactured using the lower layer film shown in FIG. 8 of the present invention.

Thereafter, the same steps as those of the first manufacturing method are performed until completion of the thin film diode shown in FIG. 9.

Specifically, as shown in FIGS. 17 and 18, the second manufacturing method is different from the first manufacturing method only in that the way to reduce the pattern dimension of the resist 6 on the pattern of the lower layer film 2 is different from the ashing process in the first manufacturing method.

[ The third manufacturing method ]

The third manufacturing method for the thin film diode of the present invention which is different from the first and second manufacturing methods will be described.

First, as shown in FIG. 16, the tantalum film 20 of 50 to 500 nm thickness as the lower layer film is formed on the glass substrate 1 by the sputtering technique. The resist 6 is formed on the film 20 and the resist 6 is patterned by the photo-lithography technique. The steps until the formation of the patterned resist 6 are the same as those of each of the foregoing manufacturing methods.

Figure 20:
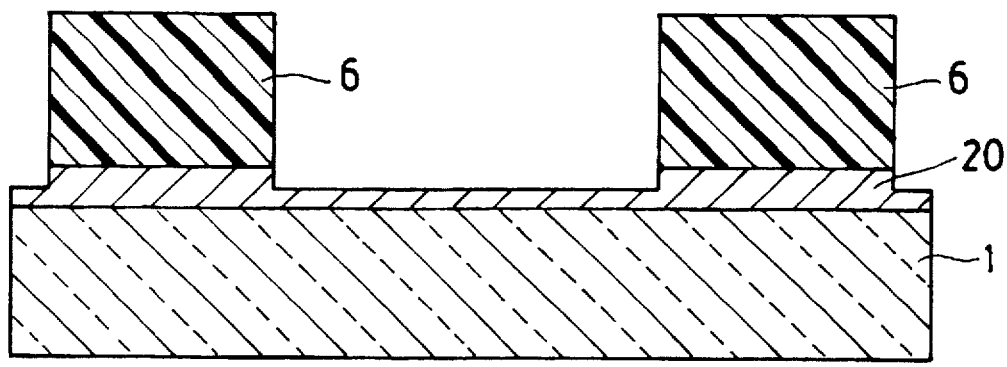

Subsequently, either the dry etching process or the wet etching process for the tantalum film 20 is performed using the patterned resist 6 as a mask. The etching process is continued until the thickness of the tantalum film 20 is reduced to substantially half as shown in FIG. 20.

Either the dry etching process or the wet etching process for the tantalum film 20 in the third manufacturing method is performed as in the same manner in each of the foregoing manufacturing methods.

Figure 21:
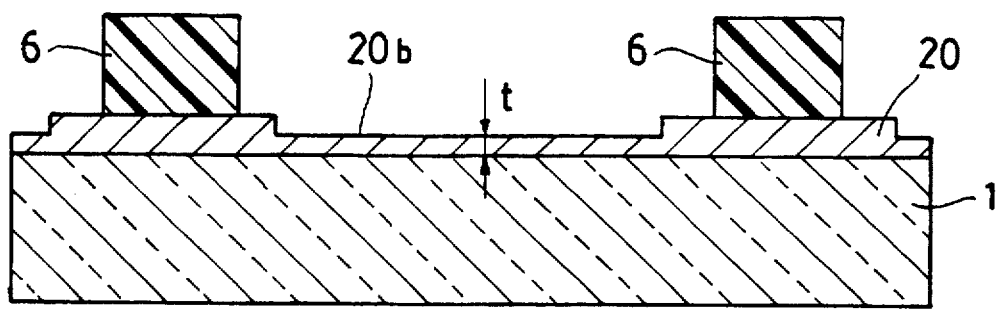

Next, as shown in FIG. 21, the ashing process for the resist 6 on the tantalum film 20 is performed, thereby reducing the pattern dimension of the resist 6. This ashing process is performed in the same manner as in the first manufacturing method.

Either the dry etching process or the wet etching process for the tantalum film 20 as the lower layer film material is again performed using the resist 6 as an etching mask with the reduced pattern dimension as described above. The etching process is continued until the thin thickness portion 20b of the tantalum film 20 is reduced to the thickness t. Thereafter, the resist 6 on the tantalum film 20 is peeled off, so that the lower layer film 2 having the step portion, i.e., the two differences in level can be formed as shown in FIG. 8.

Thereafter, the same steps as those of the first manufacturing method are performed until the thin film diode shown in FIG. 9 is completed. Specifically, the insulating film 3 is formed on the surface of the lower layer film 2 by the anodic oxidation technique. The patterned upper layer film 4 is formed thereon.

It should be noted that the lower layer film 2 presenting the vertical section having the two step portions, i.e., three differences in level, can be formed as shown in FIG. 10 by performing the ashing and the etching processes shown in FIG. 21 once more.

In addition, at the time of the ashing and etching processes, the lower layer film 2 presenting the etched vertical section having the tapered-shape as shown in FIGS. 12 or 14 can be formed by regulating the ratio of the etching speed of the resist 6 to that of the tantalum 20 as the lower layer film material.

[The Fourth Manufacturing Method]

The fourth manufacturing method of the present invention which is partially different from the third manufacturing method will be described.

In the following steps of the fourth manufacturing method, the same processes as those of the third manufacturing method are performed.

Specifically, as shown in FIG. 16, the tantalum film 20 as the lower layer material is formed on the glass substrate 1. The pattern of the resist 6 having the same pattern of the lower layer film is formed thereon. Either the dry etching process or the wet etching process for the tantalum film 20 is performed using the resist 6 as a mask. The etching process proceeds until the thickness of the film 20 is reduced to the predetermined value shown in FIG. 20.

After these steps, the resist 6 shown in FIG. 20 on the tantalum film 20 is peeled off. A resist having the smaller pattern dimension than that of the lower layer film is again formed thereon by the photo-lithography technique. Thus, the situation shown in FIG. 21 can be obtained.

The steps from the formation of the lower layer film 2 by performing the etching process again to obtaining the thin film diode shown in FIG. 9 are the same as those of the foregoing third manufacturing method. Explanations of them are omitted.

[The Fifth Manufacturing Method]

The fifth manufacturing method which is different from each of the foregoing manufacturing methods will be described.

Figure 22:
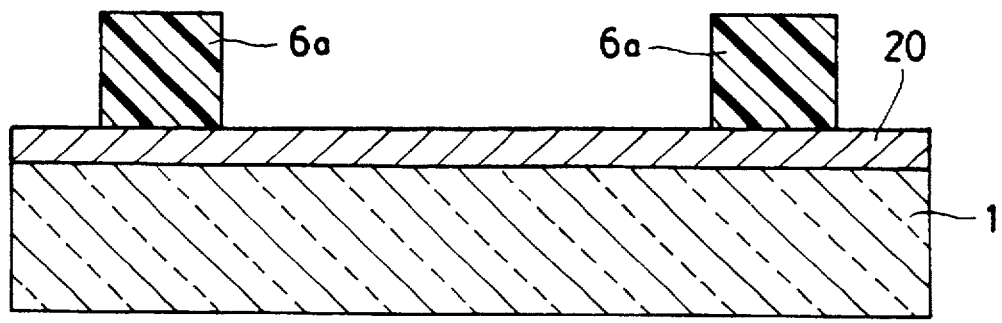

First, as shown in FIG. 22, the tantalum film 20 of 50 to 500 nm thickness as a lower layer material is formed on the glass substrate 1 by the sputtering technique. Thereafter, the pattern of the resist 6a having the same pattern dimension as that of the lower layer material is formed on the tantalum film 20 by the photo-lithography technique.

Next, either the dry etching process or the wet etching process for the tantalum film 20 serving as a lower layer film material is performed using the patterned resist 6a as a mask. The etching process proceeds until the thickness of the tantalum film 20 is reduced to a predetermined value. Specifically, the etching process proceeds until the thickness of the thin film portion 20b becomes less than half of that of the insulating film 3.

Either the dry etching process or the wet etching process for the tantalum film 20 is performed in the same manner as each of the foregoing manufacturing methods.

Figure 24:
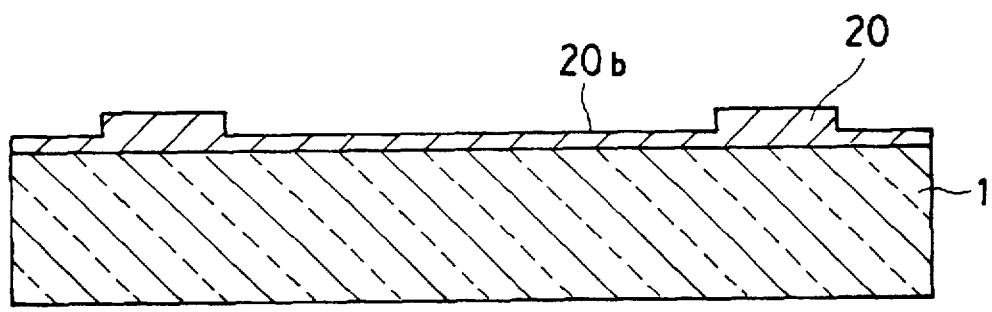

Thereafter, as shown in FIG. 24, the resist 6a which was used as the etching mask for the tantalum film 20 is peeled off.

Figure 25:
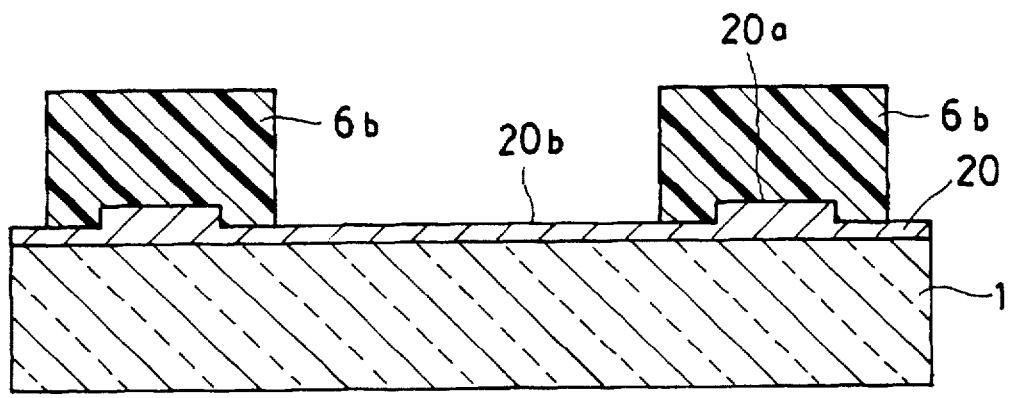

Further, as shown in FIG. 25, the resist 6b having the larger pattern dimension than the higher step stage 20a of the tantalum film 20 is formed thereon by the photo-lithography technique.

Figure 26:
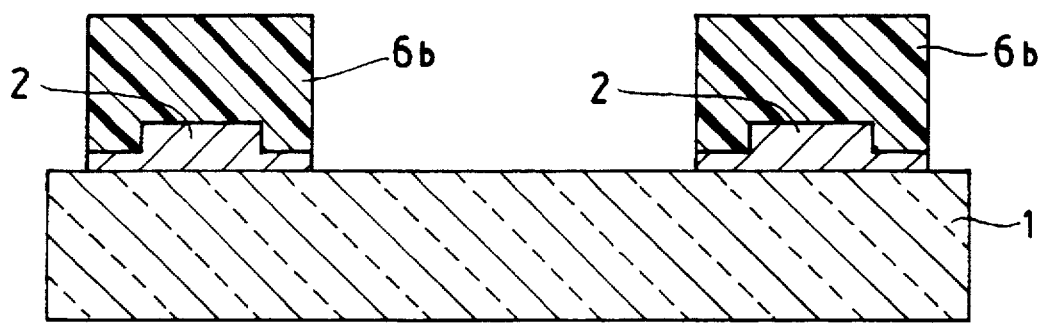

Either the dry etching process or the wet etching process for the tantalum film 20 is performed using the resist 6b having the larger pattern as a mask. The exposed portion which is the thin thickness portion of the tantalum film 20, and which is not covered with the resist 6 is removed, thereby forming the lower layer film 2 having the difference in level as shown in FIG. 26.

By peeling off the resist 6b on the lower layer film 2, the lower layer film 2 which has the vertical section presenting the two differences in level, i.e., the step portion, can be obtained.

After these steps, since each of the steps until the thin film diode is formed are the same as those of the first manufacturing method, explanations for them are omitted.

[ The Sixth Manufacturing Method]

The sixth manufacturing method of the thin film diode of the present invention will be described.

Figure 27:
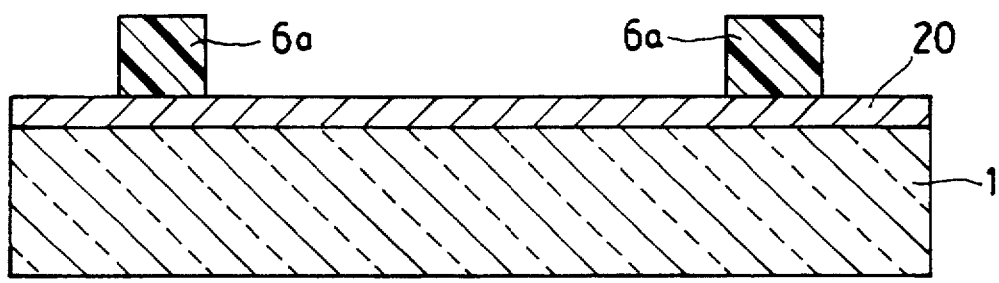

First as shown in FIG. 27, the tantalum film 20 of 50 to 500 nm thickness serving as the lower layer film material is used on the glass substrate 1 by the sputtering technique. Thereafter, the resist 6a having the same pattern as that of the lower layer film is formed on the tantalum film 20 by the photo-lithography technique.

Next, either the dry etching process or the wet etching process for the tantalum film 20 is performed using the patterned resist 6a as a mask, so that the exposed portion of the tantalum film 20 which is not covered with the resist 6a is removed. Thus, the lower layer film 2 covered with the resist 6a is formed.

Either the dry etching process or the wet etching process for the tantalum film 20 serving as the lower layer film material is performed in the same manner as each of the foregoing manufacturing methods.

Figure 29:
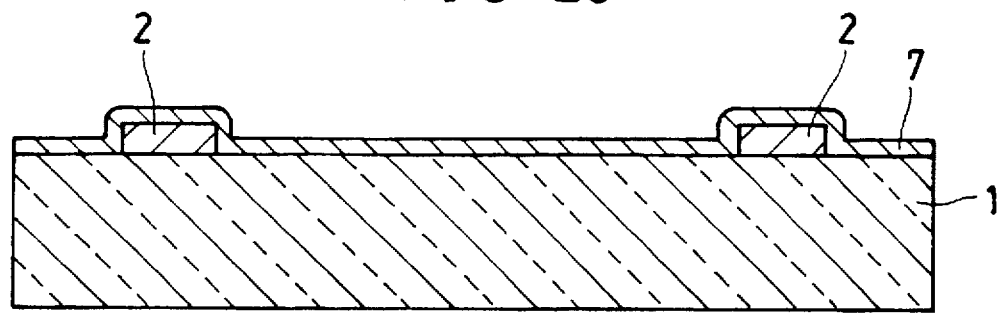

After the above processes, the resist 6a on the lower layer film 2 is peeled off, the tantalum film 7 which is the same material as that of the lower layer film 2 is formed on the entire surfaces of the glass substrate 1 and the lower layer film 2 by the sputtering technique as an insulating film, as shown in FIG. 29.

Figure 30:
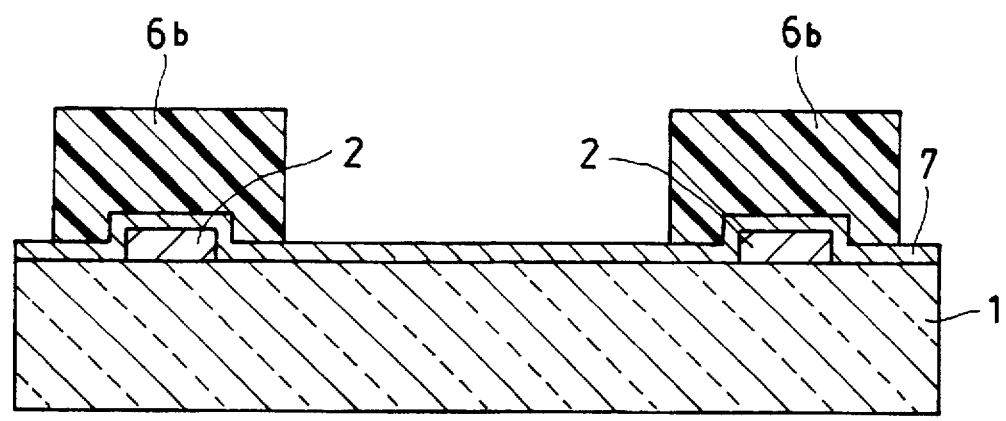

Subsequently, as shown in FIG. 30, the resist 6b having the larger pattern dimension than that of the lower layer film 2 is formed on the tantalum film 7 by the photo-lithography technique.

Figure 31:
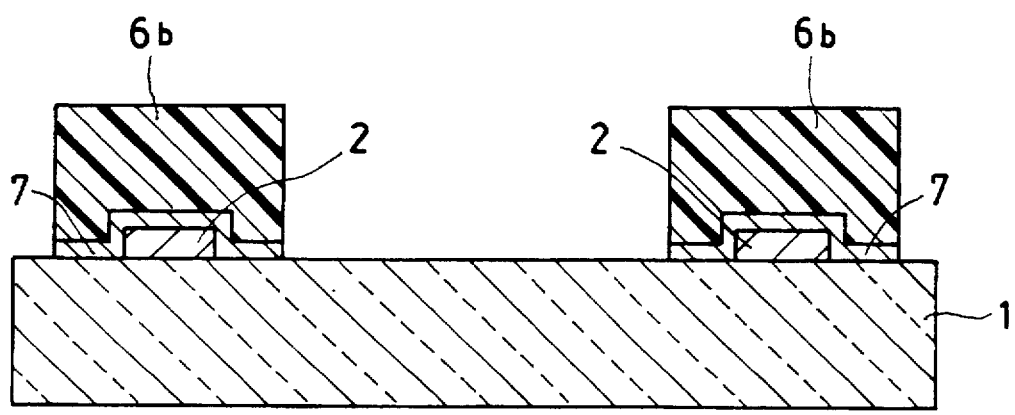

Either the dry etching process or the wet etching process for the tantalum film 7 is performed using the resist as a mask. Thus, the exposed portion of the tantalum film 7 which is not covered with the resist 6b is removed. As shown in FIG. 31, the tantalum film 7 having the two differences in level, i.e., the step portion, is left on the lower layer film 2 and the glass substrate 1 located on both sides thereof. Thus, the lower layer film 2 and tantalum film 7 made of the same material produce the same vertical section as that of the lower layer film 2 shown in FIG. 8.

Thereafter, the resist 6b is peeled off, and the surface of the tantalum film 7 is oxidized by the anodic oxidation technique, thereby forming the insulating film 3 on the pattern of the lower layer film 2. The pattern of the upper layer film 4 is formed thereon so that the thin film diode 8 causing no breaking of the upper layer film 4 can be formed as shown in FIG. 9.

[The Seventh Manufacturing Method]

The seventh manufacturing method for the thin film diode of the present invention will be described.

Figure 32:
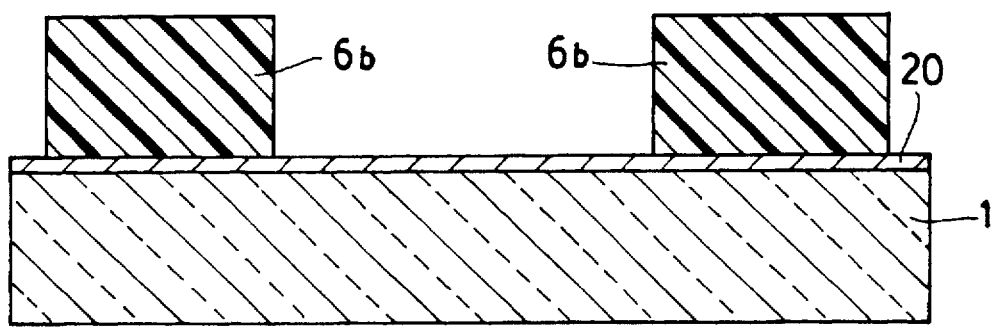

First, as shown in FIG. 32, the tantalum film 20 of 50 to 500 nm thickness as the lower layer film material is formed on the glass substrate 1 by the sputtering technique. Thereafter, the pattern of the resist 6b having the same pattern as that of the lower layer film is formed on the tantalum film 20 by the photo-lithography technique.

Figure 33:
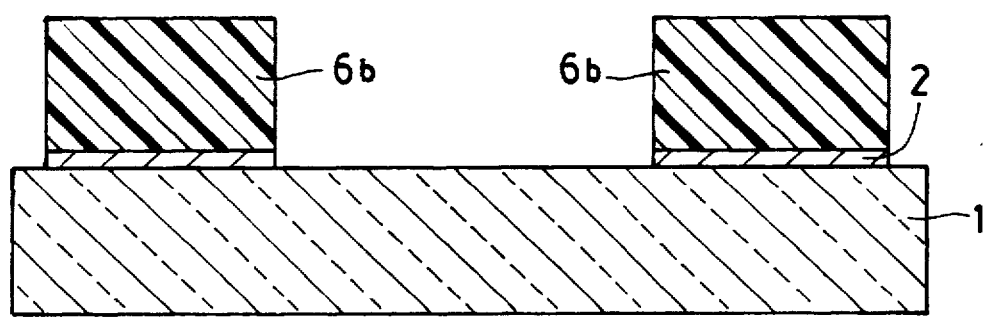

Next, either the dry etching process or the wet etching process for the tantalum film 20 is performed using the patterned resist 6b as a mask. Thus, the exposed portion of the tantalum film 20 is removed, thereby forming the lower layer film 2 as shown in FIG. 33.

Either the dry etching process or the wet etching process for the tantalum film 20 is performed in the same manner as each of the foregoing manufacturing methods.

Figure 34:
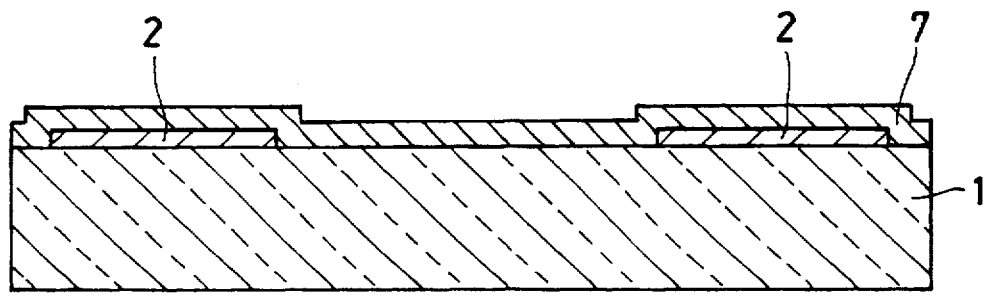

Subsequently, the resist 6b on the lower layer film 2 is peeled off, and the tantalum (Ta) film 7, which serves as an insulating material, made of the same material as that of the lower layer film, is formed on the entire surfaces of the glass substrate 1 and the lower layer film 2 by the sputtering technique as shown in FIG. 34.

Figure 35:
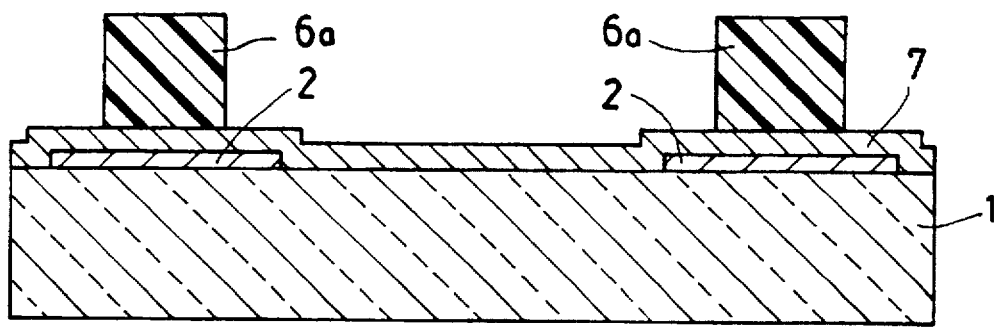

As shown in FIG. 35, the resist 6a having the smaller pattern dimension than that of the lower layer film 2 is formed on the tantalum film 7 by the photo-lithography technique.

Figure 36:
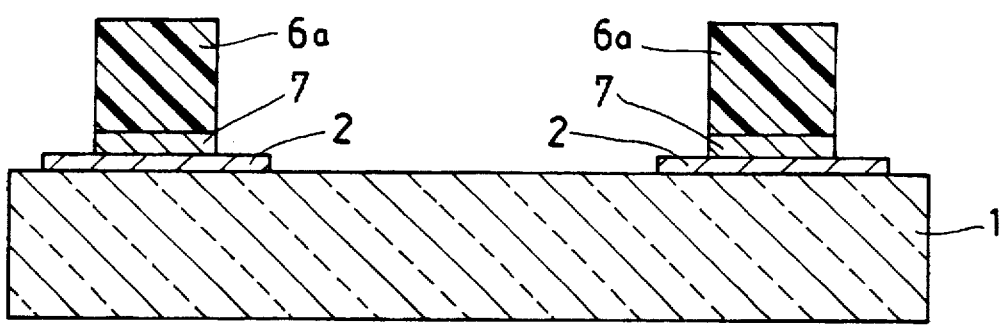

Either the dry etching process or the wet etching process for the tantalum film 7 is performed using the patterned resist 6a with the reduced pattern dimension as a mask, thereby removing the exposed portion of the tantalum film 7 which is not covered with the resist 6a. Thus, the tantalum film 7 is left only under the resist 6a as shown in FIG. 36.

Thereafter, peeling off the resist 6a, the lower layer film 2 and the tantalum film 7 in total produce the same vertical section as that of the lower layer film 2 shown in FIG. 8. The vertical section presents the two differences in level.

Further, the surfaces of the tantalum film 7 and the lower layer film 2 of the same material as that of the film 7 are oxidized by the anodic oxidation technique, thereby forming the insulating film 3 on the pattern of the lower layer film 2 as shown in FIG. 9. Forming the pattern on the upper layer film 4, the thin film diode 8 in which no breaking of the upper layer film 4 occurs can be formed.

In this method, tantalum (Ta) which is the same material as that of the lower layer film is used as the insulating film material. It is noted that any insulating film may be used as long as the insulating film can be obtained by performing the anodic oxidation process using it as an anode. Specifically, a different material from the lower layer film may be used. For example, while tantalum (Ta) is used as the lower layer film, aluminum (Al) which is a different material from tantalum may be used.

[The Eighth Manufacturing Method]

The eighth manufacturing method for the thin film diode of the present invention will be described.

First, as shown in FIG. 22, the tantalum film 20 of 50 to 500 nm thickness serving as the lower layer film is formed on the glass substrate 1 by the sputtering technique. After the formation of the film 20, the pattern of the resist 6a which is the same as that of the lower layer film is formed on the tantalum film 20 by the photo-lithography technique.

Either the dry etching process or the wet etching process for the tantalum film 20 is performed using the patterned resist 6a as a mask. Thus, the exposed portion of the tantalum film 20 is removed so that the portion of the tantalum film 20 under the resist 6a is left to use it as the lower layer film 2.

Either the dry etching process or the wet etching process for the tantalum film 20 serving as the lower layer film is performed in the same manner as each of the foregoing manufacturing methods.

Figure 38:
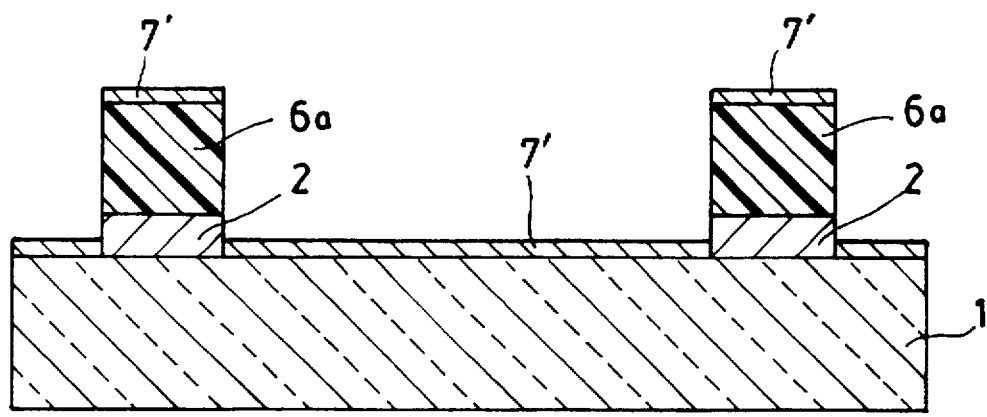

Next, as shown in FIG. 38, the tantalum film 7' of the same material as that of the lower layer film is formed on the entire surfaces of the glass substrate 1 and the resist 6 by the sputtering technique as the insulating film.

Figure 39:
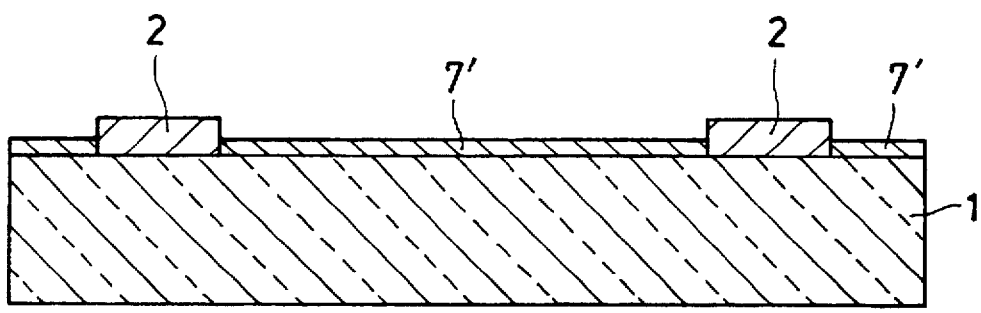

Subsequently, as shown in FIG. 39, the resist 6a is peeled off, at the same time, the tantalum film 7' on the resist 6a is removed. As a result, the tantalum film 7' can be formed in the region where the layer film 2, which is not covered with the resist 6a, is not formed.

Figure 40:
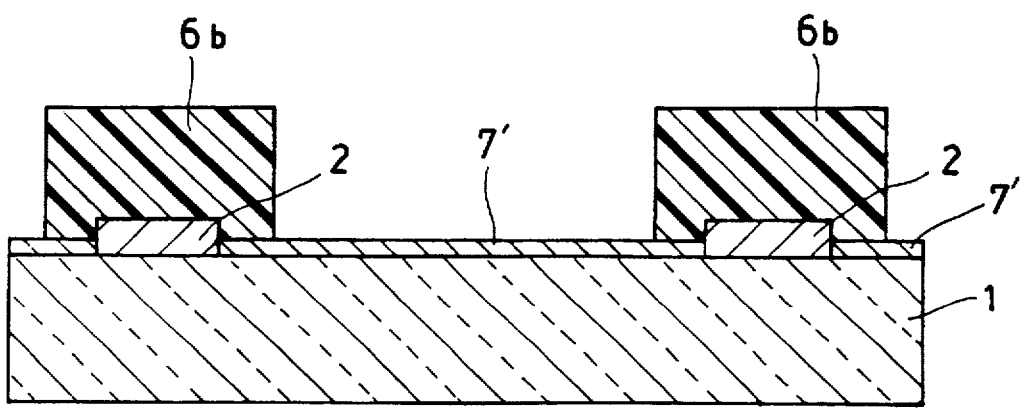

Thereafter, as shown in FIG. 40, the resist 6b having the larger pattern dimension than that of the lower layer film 2 is formed on the lower layer film 2 and the tantalum film 7' by the photo-lithography technique.

Figure 41:
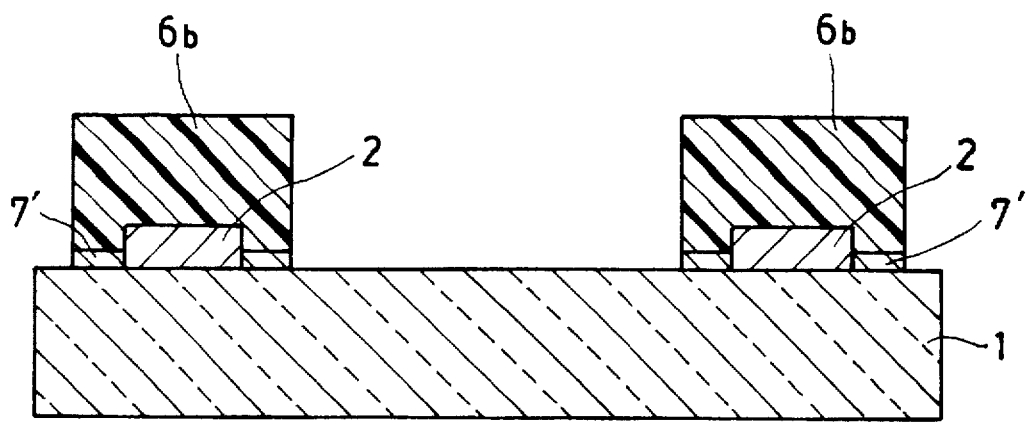

As shown in FIG. 41, either the dry etching process or the wet etching process for the tantalum film 7' is performed using the resist 6b as an etching mask. After the etching process for the tantalum film 7', and peeling off the resist 6b, the lower layer film 2 and the tantalum film 7' left on both sides of the film 2 in total produce the same vertical section as that of the lower layer film 2 shown in FIG. 8. The vertical section presents the two differences in level, i.e. the step portion.

Thereafter, the surfaces of the film 2 and the film 7' located at both sides of the film 2 are oxidized by the anodic oxidation technique, thereby forming the insulating film 3 on the pattern of the lower layer film 2 as shown in FIG. 9. The pattern of the upper layer film 4 is formed on the insulating film 3 so that the thin film diode 8 free from the breaking of the upper layer film 4 can be formed.

13

[ The Ninth Manufacturing Method ]

The ninth manufacturing method of the thin film diode of the present invention will be described.

First, as shown in FIG. 22, the tantalum film 20 of 50 to 500 nm thickness serving as the lower layer film material is formed on the glass substrate 1 by the sputtering technique. The pattern of the resist 6a having the same pattern as that of the lower layer film is formed on the tantalum film 20 by the photo-lithography technique.

Figure 23:
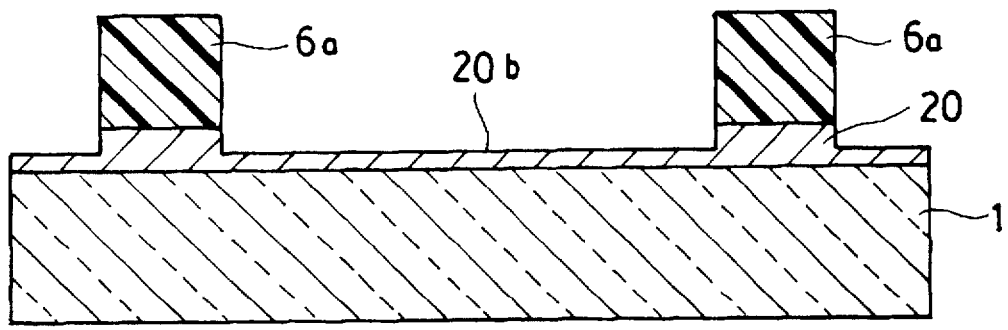

Next, as shown in FIG. 23, either the dry etching process or the wet etching process for the tantalum film 20 is performed using the resist 6a as a mask. The etching process proceeds until the tantalum film 20 is etched by the predetermined value in the thickness direction.

It should be noted that the foregoing predetermined value is the thickness of the thin thickness portion of the tantalum film 20 left after the etching of the film 20 on the glass substrate 1, which must be less than half of the thickness of the anodic oxidation film to be formed later by the anodic oxidation technique. For example, when the thickness of the anodic oxidation film is required to be 200 nm, the thickness of the thin thickness portion of the tantalum film 20 left on the glass substrate 1 after the etching is set less than 100 nm.

Either the dry etching process or the wet etching process for the tantalum film 20 serving as the lower layer film is performed in the same manner as each of the manufacturing methods.

As shown in FIG. 24, the resist 6a on the lower layer film 2 which was used as the mask is peeled off.

Figure 42:
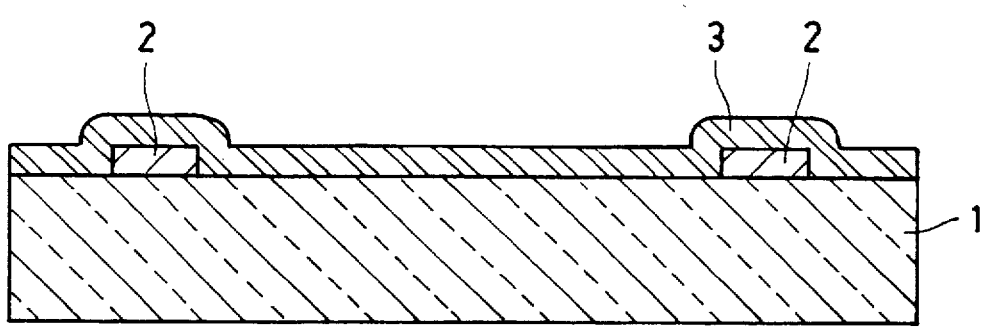

Subsequently, the thin thickness portion 20b of the tantalum film 20 shown in FIG. 24 is oxidized by the anodic oxidation technique using the film 20 as an anode thereby forming the insulating film 3 as shown in FIG. 42. The entire thin thickness portion 20b of the tantalum film 20 is converted to the insulating film 3. The lower layer film is patterned.

Figure 43:
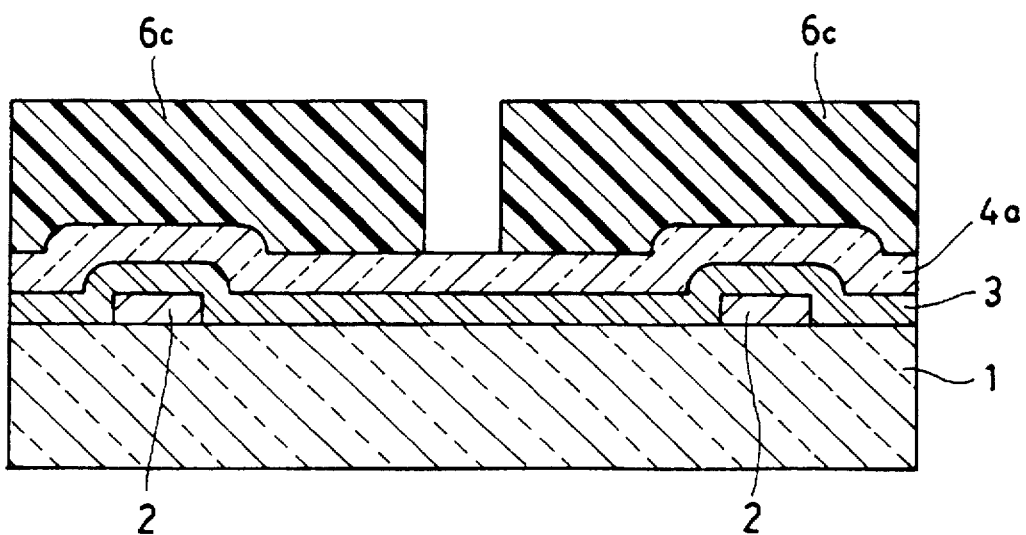

Further, as shown in FIG. 43, the indium-tin-oxide (ITO) film 4a serving as the upper layer film material is formed on the insulating film 3 by the sputtering technique.

The formation of the indium-tin-oxide film 4a is performed in the following manner. Specifically, argon gas of the flow rate 100 sccm and oxygen gas of the glow rate 2 sccm are conducted into the sputtering device. Total pressure in the device is regulated at 10 mTorr. Radio frequency electrical power (oscillation frequency: 13.56 MHz) of an output power 1 to 3 KW is applied to generate plasma. Indium tin serving as the target material is sputtered by the generated plasma as indium-tin-oxide. The sputtered indium-tin-oxide is deposited on the insulating film 3.

Next, as shown in FIG. 43, the pattern of the resist 6c having the same pattern as that of the upper layer film is formed on the indium-tin-oxide film 4a serving as the upper layer film by the photo-lithography technique.

Either the dry etching process or the wet etching process for the indium-tin-oxide film 4a is performed using the resist 6a as a mask.

Figure 44:
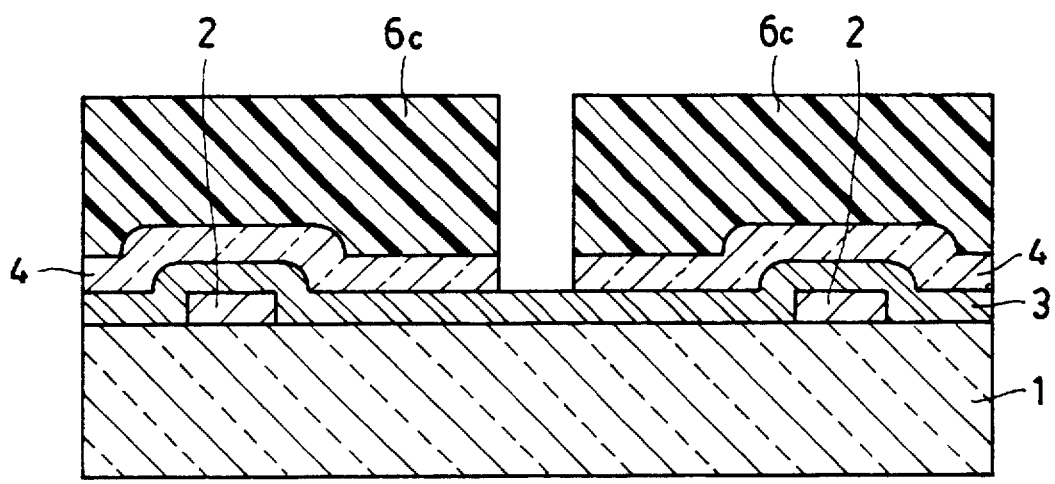

By this etching process for the indium-tin-oxide film 4a, the upper layer film 4 is formed as shown in FIG. 44.

When the etching process for the indium-tin-oxide film 4a is performed by the dry etching technique, the etching process is performed in the following manner. Specifically, methane (CH4) of the flow rate 100 to 500 sccm is introduced into the dry etching device. Hydrogen of the flow rate 0 to 100 sccm and methanol (CH3OH) of the flow rate 0 to 100 sccm are added to the dry etching device. The total pressure at the device is regulated at 30 to 200 mTorr. Then, radio frequency electrical power of an oscillation frequency

14

13.56 MHz and an output power 1 to 3 KW is applied to produce plasma. The etching process is performed using this plasma.

Further, when the etching process for the indium-tin-oxide film 4a is performed by the wet etching technique, it is performed using the solution in which iron hydrochloride, hydrochloric acid, and water are blended in a 3:5:2 ratio.

After the etching process, the resist 6c is peeled off, thereby obtaining the thin film diode free from the breaking of the upper layer film 4.

Figure 46:
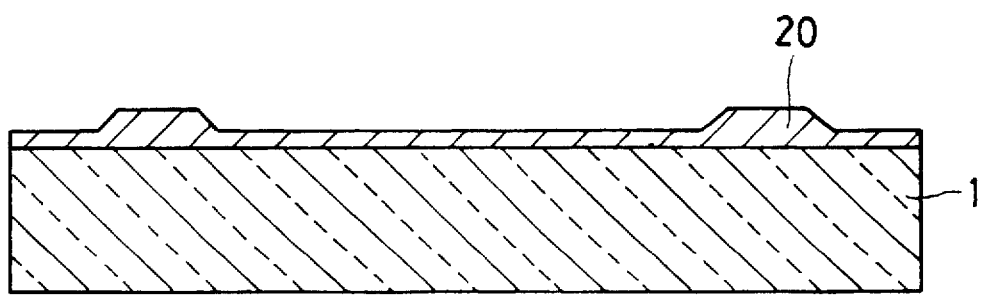
Figure 47:
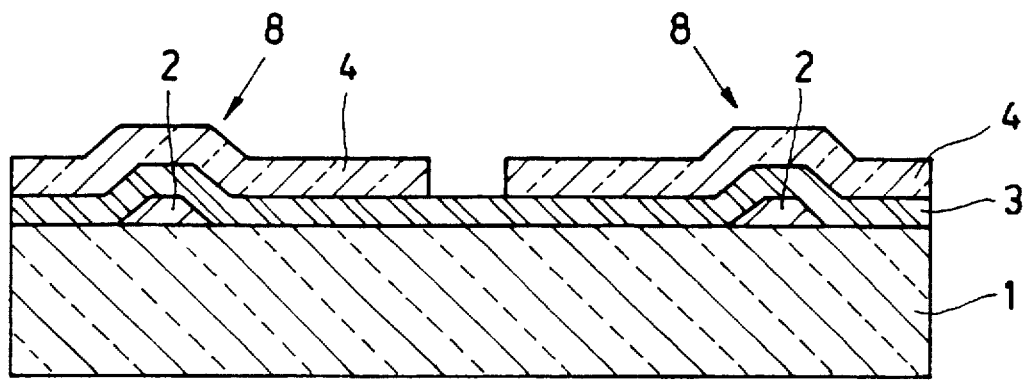

Further, at the time of the etching of the tantalum film 20 serving as the lower layer film in the manufacturing step shown in FIG. 22, by regulating the flow rate of oxygen, the etching rate of the resist 6a to the tantalum film 20 is controlled. As a result, the vertical section of the tantalum film 20 obtained by the etching process may be tapered-shaped as shown in FIG. 46. When the thin film diode 8 is formed in the foregoing manner using the tantalum film 20 formed by this method, the vertical section, having such a structure that the upper layer film 4 is more likely to be overlapped shown in FIG. 47, is obtained.

[ The Tenth Manufacturing Method ]

The tenth manufacturing method for the thin film diode of the present invention will be described.

Also in this manufacturing method, first, the tantalum film 20 of 50 to 500 nm thickness serving as the lower layer film is formed on the glass substrate 1 by the sputtering technique as shown in FIG. 27. The pattern of the resist 6a having the same pattern as that of the lower layer film is formed on the tantalum film 20 by the photo-lithography technique.

Figure 28:
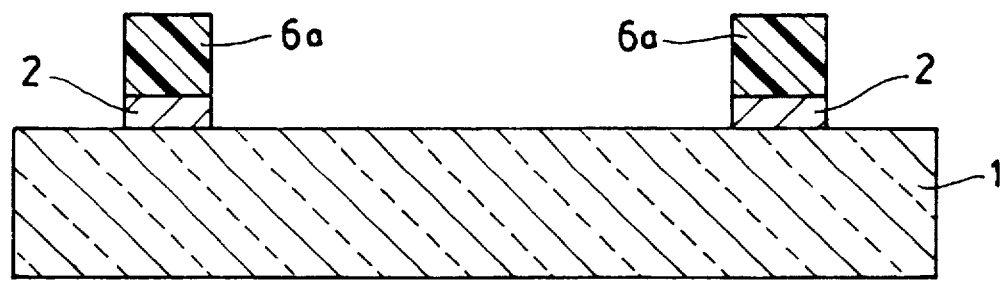

Thereafter, either the dry etching process or the wet etching process for the tantalum film 20 serving as the lower layer film is performed using the patterned resist 6a, thereby forming the pattern of the lower layer film 2 as shown in FIG. 28.

Either the dry etching process or the wet etching process for the tantalum film 20 is performed in the same manner as each of the foregoing manufacturing methods.

Next, the resist 6a on the lower layer film 2 is peeled off. The tantalum film 7 of the same material as that of the lower layer film 2 is formed on the entire surface including the pattern of the lower layer film 2 by the sputtering technique as shown in FIG. 29. The tantalum film 2 serves as the insulating film material.

At the formation of the tantalum film 7, the thickness of the film 7 is made less than half of the thickness of the anodic oxidation film.

Next, as shown in FIG. 42, the tantalum film 7 is oxidized by the anodic oxidation technique, thereby forming the insulating film 3 on the lower layer film 2.

Further, as shown in FIG. 43, the indium-tin-oxide (ITO) film 4a serving as the upper lower layer film material is formed on the insulating film 3 by the sputtering technique.

Subsequently, the same pattern of the resist 6c as that of the upper layer film is formed on the indium-tin-oxide film 4a by the photo-lithography technique. As shown in FIG. 44, the upper layer film 4 is formed using the pattern of the resist 6c as an etching mask by the wet etching technique. Thereafter, peeling off the resist 6c, the thin film diode 8 having the structure shown in FIG. 45 can be obtained.

Further, at the time of the etching of the tantalum film 20 serving as the lower layer film in the manufacturing step shown in FIG. 27, by regulating the flow rate of oxygen, the etching rate of the resist 6a to the tantalum 20 is controlled. As a result, the vertical section of the tantalum film 20 obtained by the etching process may be tapered-shaped. When the thin film diode 8 is formed in the foregoing manner using the tantalum film 20 formed by this method. the vertical section, having such a structure that the upper layer film 4 is more likely to be overlapped. is obtained shown in FIG. 47.

| The Eleventh Manufacturing Method |

The eleventh manufacturing method for the thin film diode of the present invention will be described.

First, as shown in FIG. 22, the tantalum film 20 of 50 to 500 nm thickness, which serves as the lower layer film material, is formed on the glass substrate 1 by the sputtering technique. Subsequently, the pattern of the resist 6a having the same pattern as that of the lower layer film is formed on the tantalum film 20 by the photo-lithography technique.

Figure 37:
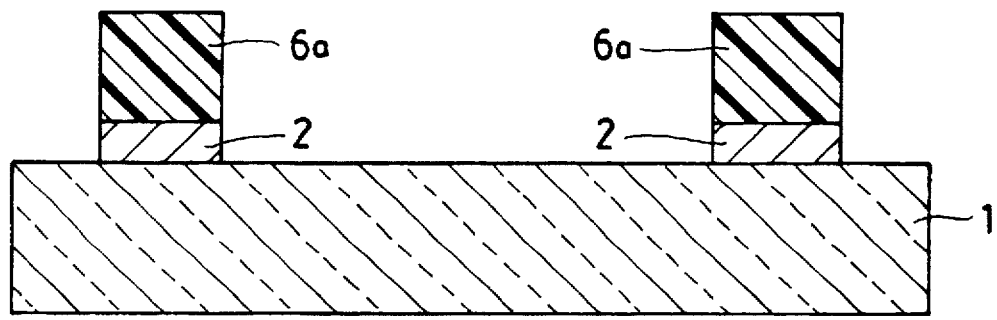

The dry etching process for the tantalum film 20 is performed using the patterned resist 6a as an etching mask, thereby forming the pattern of the lower layer film 2 as shown in FIG. 37.

Either the dry or wet etching processes for the tantalum film 20 is performed in the same manner as in each of the foregoing manufacturing methods.

Subsequently, as shown in FIG. 38, the tantalum film 7', which serves as the insulating film material, of the same material as that of the lower layer film 2, is formed on the entire surfaces of the glass substrate 1 and the resist 6a using the sputtering technique.

It is noted that the thickness of the tantalum film 7' formed in the process of FIG. 38 is made less than half of that of the anodic oxidation film.

As shown in FIG. 39, the resist 6a on the lower layer film 2 as well as the tantalum film 7' thereon is removed.

Next, the glass substrate 1 and the tantalum film 7' on the lower layer film 2 are oxidized by the anodic oxidation technique so that the insulating film 3 is formed as shown in FIG. 42.

Figure 45:
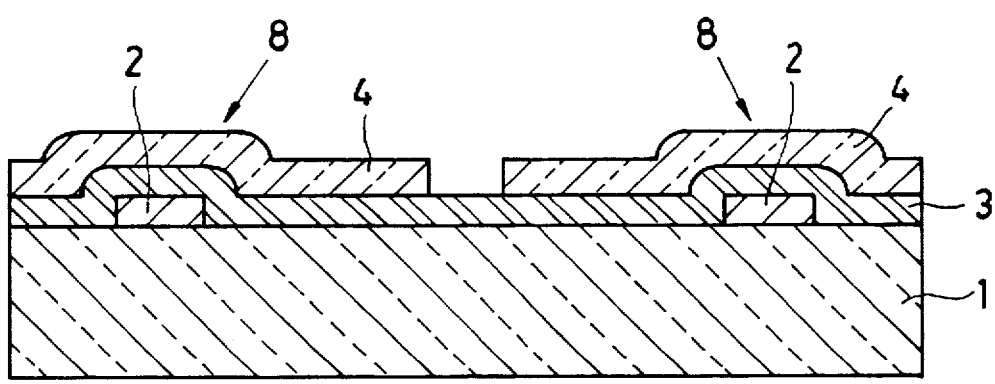

Thereafter, the steps from the formation of the upper layer film 4 to the completion of the thin film diode 8 shown in FIG. 45 are the same as those of the tenth manufacturing method.

| The Twelfth Manufacturing Method |

The twelfth manufacturing method for the thin film diode of the present invention will be described.

In this manufacturing method, first, the tantalum film 20 of 50 to 500 nm thickness serving as the lower layer film is formed on the glass substrate 1 by the sputtering technique as shown in FIG. 22. The pattern of the resist 6a having the same pattern as that of the lower layer film is formed on the tantalum film 20 by the photo-lithography technique.

Figure 48:
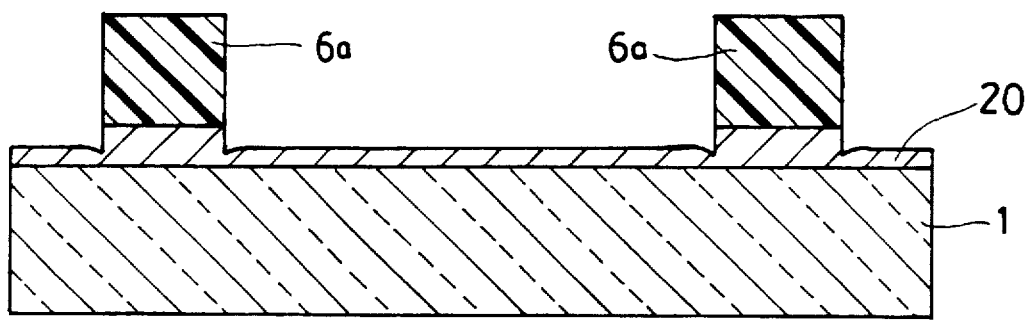

Next, as shown in FIG. 48, either the dry etching process or the wet etching process for the tantalum film 20 is performed using the resist 6a as a mask. The etching process proceeds until the tantalum film 20 is etched by the predetermined value in the thickness direction.

It should be noted that the foregoing predetermined value is the thickness of the tantalum film 20 left after the etching of the film 20 on the glass substrate 1, which must be less than half of the thickness of the anodic oxidation film to be formed later by the anodic oxidation technique.

When the etching of the tantalum film 20 is carried out by the dry etching process, the flow rate of the sulfur hexafluoride among the etching conditions is increased. Staying of fluoride free radicals in the vicinity of the pattern of the resist 6a is made easy to maintain. The concentration of the sulfur hexafluoride is increased partially to enhance the etching speed.

For this reason, the vertical section obtained by etching the tantalum film 20 presents such a shape that the edge portion of the pattern of the resist 6a is more deeply etched than the other portion as shown in FIG. 48.

Further, when the etching process for the tantalum film 20 is performed by the wet etching technique, it is performed by dipping the glass substrate 1 in the solution in which nitric acid, ammonium fluoride, hydrofluoric acid, and water are blended in a 7:2:1:3 ratio.

At the time of transferring the glass substrate 1 into a washing bath after lifting the substrate 1 from the solution, if an interval between lifting the substrate 1 from the solution and transferring the substrate 1 into the washing bath, i.e., the waiting time, is made, the etchant is likely to stay in the vicinity of the pattern of the resist 6a. The portion where the etchant stays is etched faster than other portions so that the vertical section also presents such shape that the edge portion of the pattern of the resist 6a is more deeply etched than the other portion as shown in FIG. 48.

Next, as shown in FIG. 48, the resist 6a is peeled off, then the insulating film 3 is formed by oxidizing the surface of the tantalum film 20 with the anodic oxidation technique. At the same time, the lower layer film 2 is patterned.

At this time, since the thickness of the tantalum film 20 in the vicinity of the lower layer film 2 is thinner than in the other portion thereof, the oxidation is stopped earlier than the central portion between the lower layer films 2. This produces the unoxidized portion 10 at the center portion of the tantalum film 20.

Figure 50:
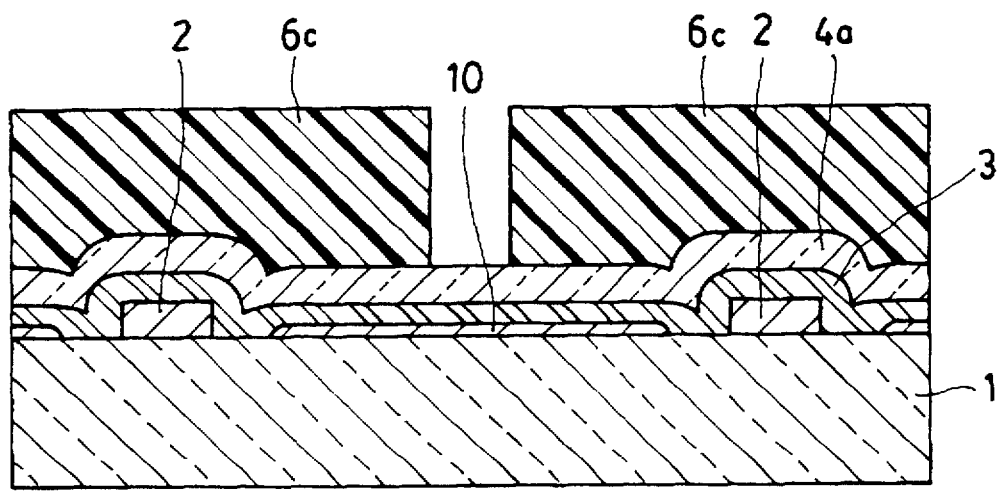

Further, as shown in FIG. 50, the indium-tin-oxide (ITO) film 4a serving as the upper layer film is formed on the insulating film 3 by the sputtering technique. Thereafter, the pattern of the resist 6c having the same pattern as the upper layer film is formed on the indium tin oxide film 4a by the photo-lithography technique.

Figure 51:
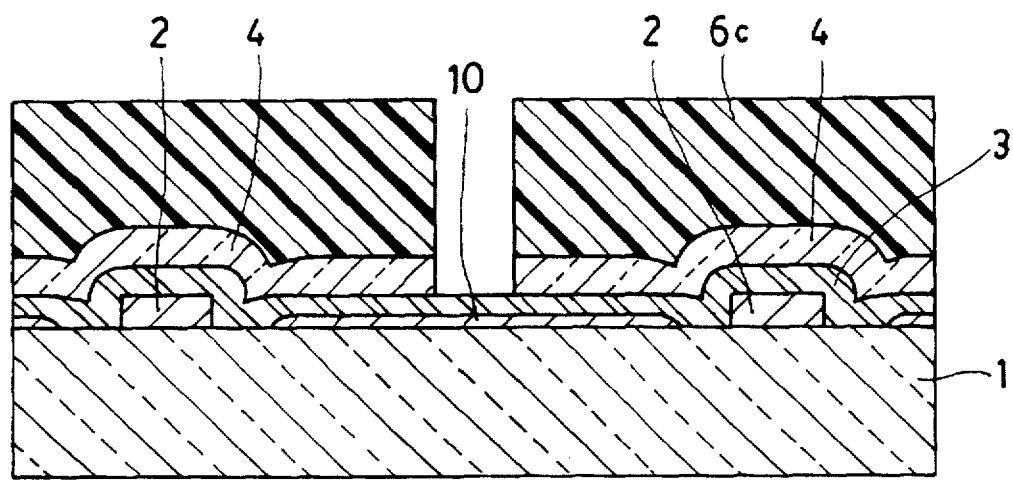

As shown in FIG. 51, using the pattern of the resist 6c as an etching mask, the upper layer film 4 is patterned by etching the indium tin oxide film 4a with either the dry etching process or the wet etching process.

Figure 52:
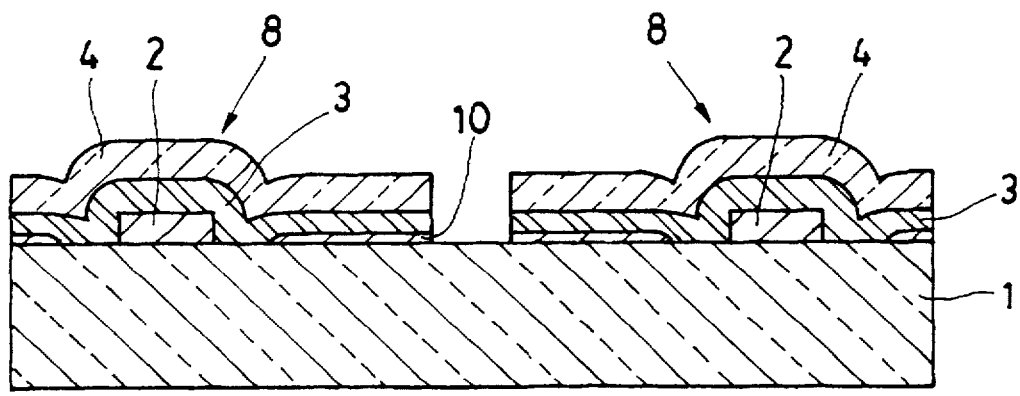

Thereafter, the insulating film 3 is etched using the pattern of the upper layer film 4 as an etching mask by either the dry etching process or the wet etching process. Thus, the thin film diode 8 is formed free from the breaking of the upper layer film 4 as shown in FIG. 52.

The etching process for the insulating film 3 may be performed after peeling off the resist 6c used for formation of the pattern of the upper layer film 4, or it may be performed without peeling off the resist 6c and then the resist 6 may be peeled off.

The dry etching process for the insulating film 3 is performed under the same conditions as those of the dry etching process for the tantalum film 20 described above.

Figure 53:
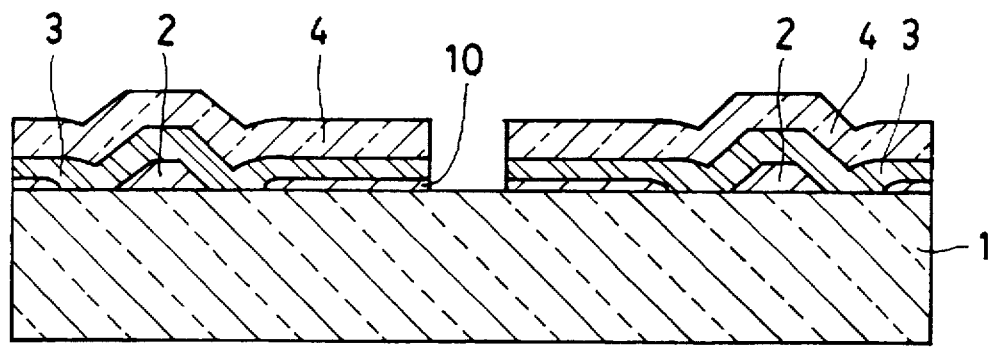

Further, as shown in FIG. 43, at the time of the etching of the tantalum film 20 serving as the lower layer film, by regulating the flow rate of oxygen, the etching rate of the resist 6a to the tantalum 20 is controlled. As a result, the vertical section of the tantalum film 20 obtained by the etching process may be taper-shaped as shown in FIG. 46. In this case, the finally obtained thin film diode 8 is shown in FIG. 53. The thin film diode 8 has such a structure that the upper layer film 4 is more likely to be overlapped.

| The Thirteenth Manufacturing Method |

The thirteenth manufacturing method for the thin film diode of the present invention will be described.

Figure 49:
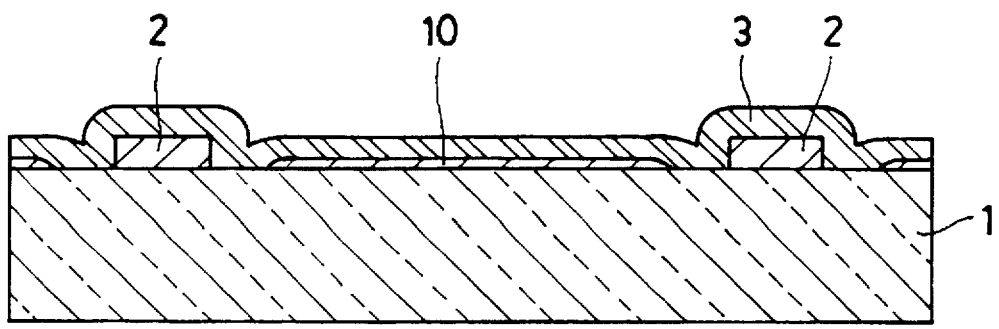

First, the structure composed of the patterned lower layer film 2 and the insulating film 3 which are formed on the glass substrate 1 can be obtained using the same method as the foregoing method, as shown in FIG. 49.

Further, as shown in FIG. 50, the indium tin oxide (ITO) film 4a serving as the upper layer film is formed on the insulating film 3 by the sputtering technique.

Thereafter, the pattern of the resist 6c having the same pattern as that of the upper layer film is formed on the indium tin oxide film 4a by the photo-lithography technique.

Further, as shown in FIG. 51, the upper layer film 4 is patterned by either the dry etching technique or the wet etching technique using the resist 6c as an etching mask.

Either the dry etching process or the wet etching process for the indium tin oxide film 4a is performed in the same manner as each of the foregoing manufacturing methods.

Figure 54:
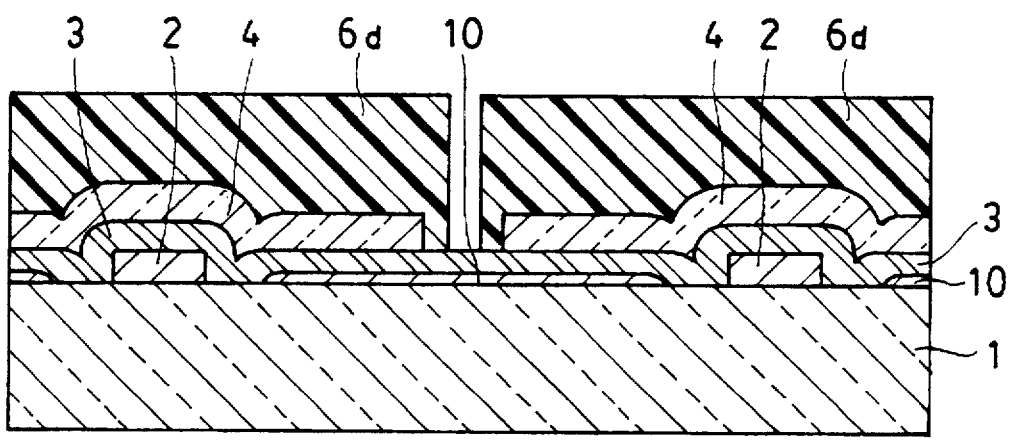

Further, the resist 6c on the patterned upper layer film 4 is peeled off. As shown in FIG. 54, the pattern of the resist 6d, larger than that of the upper layer film 4, is formed.

The insulating film 3 is etched by the dry etching technique using the resist 6d as an etching mask. Thus, the thin film diode 8, which has the structure shown in FIG. 55, free from the breaking of the upper layer film 4, can be formed.

The dry etching process for the insulating film 3 is performed under the same conditions as that of the dry etching process for the foregoing tantalum film 20.

[ The Fourteenth Manufacturing Method ]

The fourteenth manufacturing method of the thin film diode of the present invention will be described.

Also in this manufacturing method, the pattern of the lower layer film 2 and the insulating film 3 as shown in FIG. 49 are formed on the glass substrate 1 in the same method as those of the foregoing twelfth and thirteenth manufacturing methods.

Further, as shown in FIG. 50, the indium-tin-oxide (ITO) film 4a which is an upper layer film material is formed on the insulating film 3 using the sputtering technique. The pattern of the resist 6c which is the same as that of the upper layer film is formed on the indium-tin-oxide film 4a by the photo-lithography technique.

As shown in FIG. 51, the pattern of the upper layer film 4 is formed using the pattern of the resist 6c as an etching mask by either the dry etching technique or the wet etching technique.

Either the dry etching processing or the wet etching processing for the indium-tin-oxide film 4a, which is an upper layer film material, is carried out in the same manner as in those of the foregoing manufacturing methods.

Figure 56:
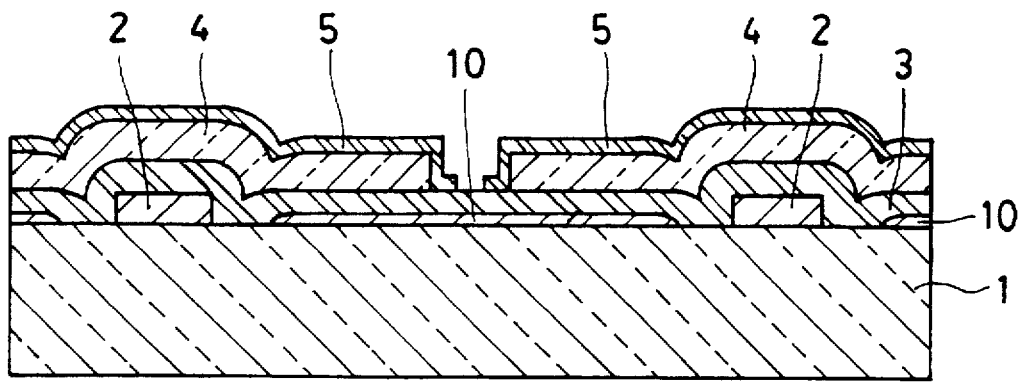

Thereafter, the resist 6c on the patterned upper layer film 4 is peeled off, thereby forming the pattern of the protection film 5 having the larger pattern dimension than that of the upper layer film 4 is formed as shown in FIG. 56.

Figure 57:
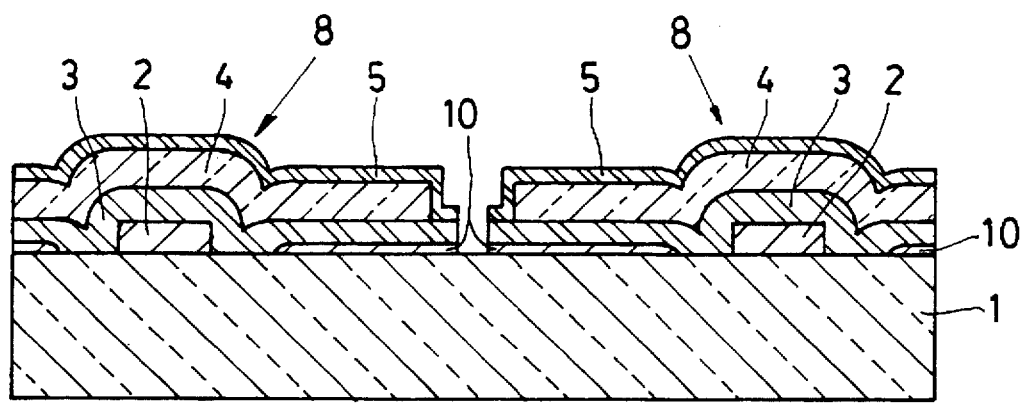

Subsequently, the insulating film 3 is etched using the pattern of the protection film 5 as an etching mask using the dry etching technique, thereby completing the thin film diode 8 as shown in FIG. 57.

In this manufacturing method, the dry etching processing for the insulating film 3 is carried out under the same conditions as those of the foregoing dry etching processing for the tantalum film 20.

[ The Fifteenth Manufacturing Method ]

The fifteenth manufacturing method for the thin film diode of the present invention will be described.

Also in this case, the pattern of the lower layer film 2 and the insulating film 3, shown in FIG. 49, are formed on the glass substrate 1 by using the same method as that of the twelfth and thirteenth methods.

Figure 58:
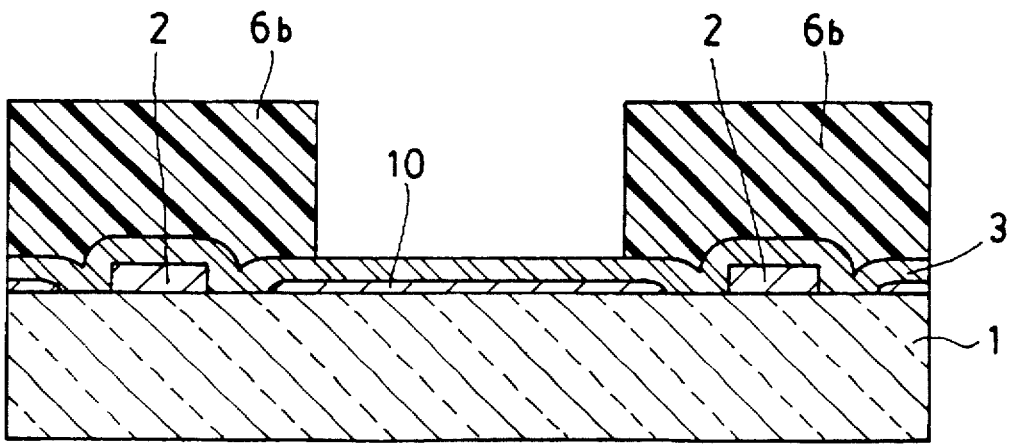

As shown in FIG. 58, the pattern of the resist 6b having a larger pattern dimension than that of the patterned lower layer film 2 is formed by the photo-lithography technique.

Next, the insulating film 3 is etched using the patterned resist 6b as an etching mask by the dry etching technique. And, then the resist 6b on the insulating film 3 is peeled off, thereby obtaining the structure shown in FIG. 59.

The dry etching process for the insulating film 3 is performed under the same conditions as those of the foregoing dry etching process for the tantalum film 20.

Thereafter, the indium-tin-oxide (ITO) film 4a serving as the upper layer film material is formed on the insulating film 3 and the glass substrate 1 by the sputtering technique.

The pattern of the resist having the same pattern as that of the upper layer film on the indium-tin-oxide film 4a by the photo-lithography technique. The indium-tin-oxide film 4a is etched using the resist as an etching mask by either the dry etching technique or the wet etching technique.

Figure 60:
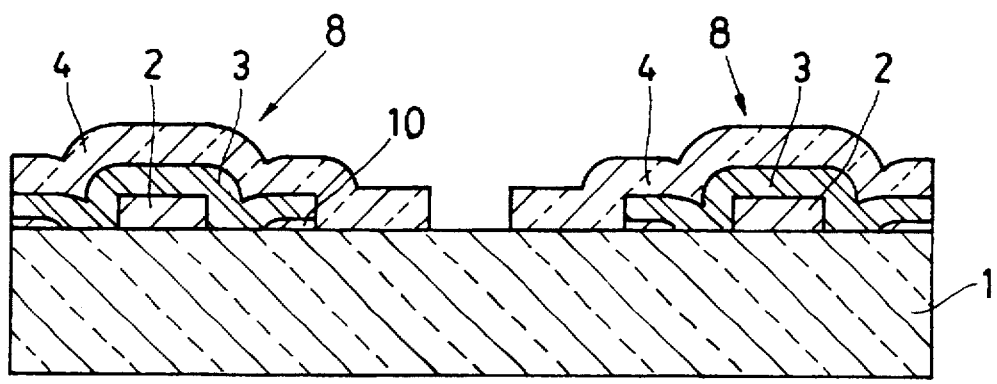

By etching the film 4a, the pattern of the upper layer film 4 is formed as shown in FIG. 60. As a result, the thin film diode 8 free from the breaking of the upper layer film 4 can be completed.

Figure 61:
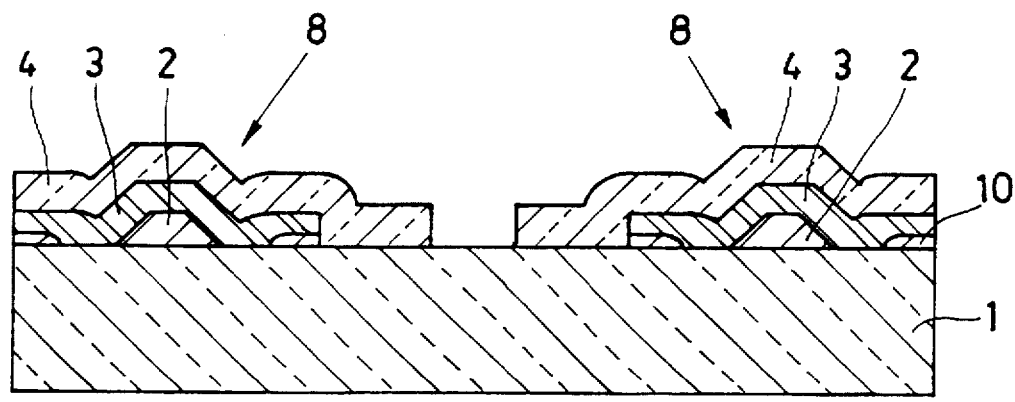

Further, in the situation shown in FIG. 22, at the time of the etching of the tantalum film 20 serving as the lower layer film, by regulating the flow rate of oxygen, the etching rate of the resist 6a to the tantalum 20 is controlled. As a result, the vertical section of the tantalum film 20 obtained by the etching process may be tapered-shaped. In this case, the finally obtained thin film diode 8 is shown in FIG. 61. The thin film diode 8 has such a structure that the upper layer film 4 is more likely to be overlapped.

[ The Sixteenth Manufacturing Method ]

The sixteenth manufacturing method for the thin film diode of the present invention will be described.

In this manufacturing method, as shown in FIG. 27, the tantalum film 20 of 100 to 500 nm thickness, which is the lower layer film material, is formed on the glass substrate 1 by the sputtering technique as shown in FIG. 27. The pattern of the resist 6a having the pattern as that of the lower layer film is formed on the tantalum film 20 by the photo-lithography technique.

Either the dry etching process or the wet etching process to etch the tantalum film 20 using the patterned resist 6a as an etching mask is performed, thereby forming the pattern of the lower layer film 2 as shown in FIG. 28.

Figure 62:
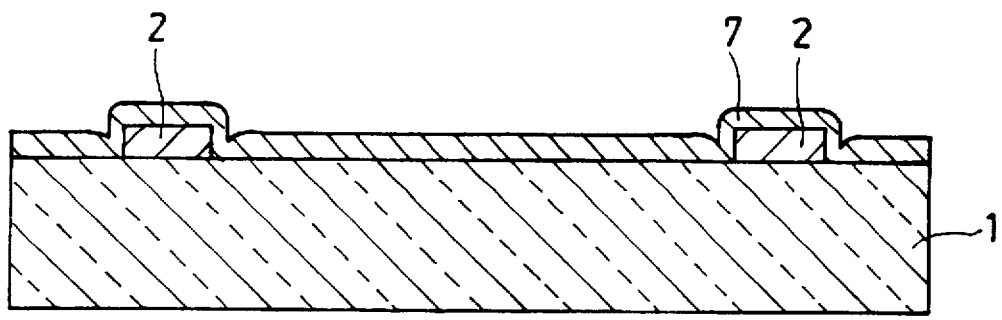

As shown in FIG. 62, after peeling off the resist 6a on the lower layer film 2, the tantalum film 7 of the same material as that of the lower layer film 2, which is the insulating film material, is again formed on the pattern of the lower layer film 2 and the glass substrate 1 by the sputtering technique.

At the time of the formation of the film 7, if the pressure in a sputtering device is lowered, the mean free path of tantalum atoms is lengthened so that the thickness of the portion of the film 7 in the vicinity of the lower layer film 2 is thin due to the influence of the pattern. As a result, the vertical section shown in FIG. 62 can be obtained.

In the formation of the film 7, it should be noted that the thickness of the film 7 is less than half of that of the anodic oxidation film.

Subsequently, as shown in FIG. 49, the insulating film 3 is formed by oxidizing the surface of the tantalum film 7 with the anodic oxidation technique.

Further, as shown in FIG. 50, the indium-tin-oxide (ITO) film 4a, which is the upper layer film material, is formed on the insulating film by the sputtering technique. Thereafter, the pattern of the resist 6c having the same pattern as that of the upper layer film 4 is formed on the indium-oxide film 4a by the photo-lithography technique.

As shown in FIG. 51, the pattern of the upper layer film 4 is formed by etching the indium tin oxide film 4a with either the dry etching technique or the wet etching technique, using the pattern of the resist 6c as an etching mask.

Further, as shown in FIG. 52, the thin film diode 8 can be completed by etching, using the upper layer film 4 as an etching mask, the insulating film 3 and the anodic un-oxidation portion 10 with the dry etching technique.

The dry etching process for the insulating film 3 and the anodic unoxidized portion 10 is performed under the same conditions as those of the foregoing dry etching process for the tantalum film 20.

Further, in the situation shown in FIG. 27, at the time of the etching of the tantalum film 20 which is the lower layer film, by regulating the flow rate of oxygen, the etching rate of the resist 6a to the tantalum 20 is controlled. As a result, the vertical section of the lower layer film 2 obtained by the etching process may be taper-shaped. In this case, the finally obtained thin film diode 8 is shown in FIG. 53. The thin film diode 8 has such a structure that the upper layer film 4 is more likely to be overlapped as shown in FIG. 61.

| The Seventeenth Manufacturing Method |

The seventeenth manufacturing method for the thin film diode of the present invention will be described.

In this manufacturing method, as shown in FIG. 22, the tantalum film 20 of 100 to 500 nm thickness, which is the lower layer film material, is formed on the glass substrate 1 by the sputtering technique. The pattern of the resist 6a having the pattern as that of the lower layer film is formed on the tantalum film 20 by the photo-lithography technique.

Either the dry etching process or the wet etching process to etch the tantalum film 20 using the patterned resist 6a as an etching mask is performed, thereby forming the pattern of the lower layer film 2 as shown in FIG. 37.

Figure 63:
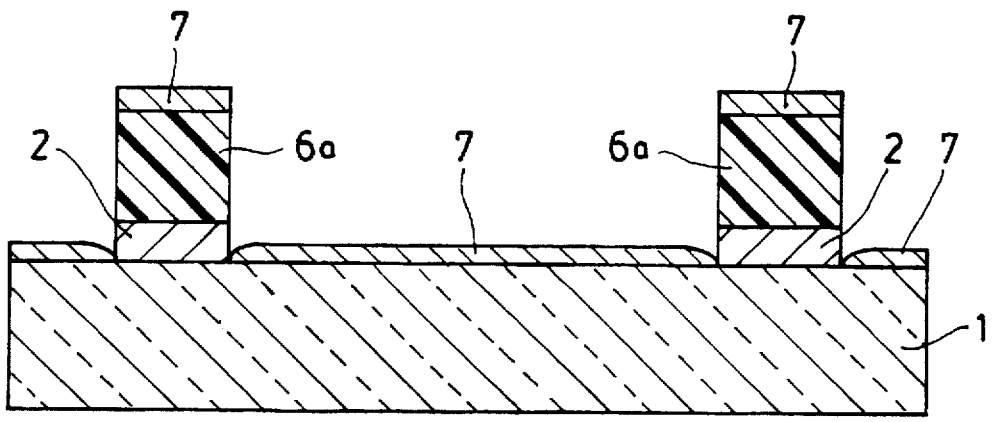

As shown in FIG. 63, the tantalum film 7 of the same material as that of the lower layer film 2, which is the insulating film material, is formed by the sputtering technique.

At the time of the formation of the film 7, if the pressure in the sputtering device is lowered, the mean free path of tantalum atoms is lengthened so that the thickness of the portion of the film 7 in the vicinity of the lower layer film 2 is thin due to the influence of the pattern. As a result, the vertical section shown in FIG. 63 can be obtained.

In the formation of the film 7, it should be noted that the thickness of the film 7 is less than half of that of the anodic oxidation film. For example, the thickness of the film 7 is less than 100 nm, when the thickness of the anodic oxidation film is 200 nm.

Figure 64:
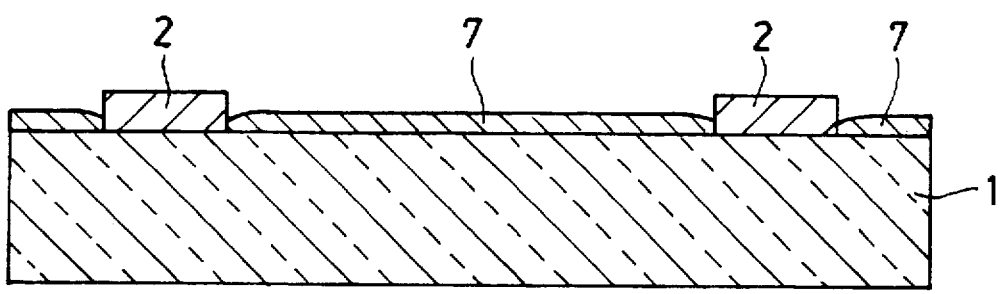

Next, as shown in FIG. 64, the resist 6a is peeled off as well as the tantalum film 7 thereon.

The insulating film 3 is formed on the upper layer film 2 by oxidizing the surfaces of the lower layer film 2 and the tantalum film 7 with the anodic oxidation technique, as shown in FIG. 49.

At this time, since the thickness of the portion of the tantalum film 7 in the vicinity of the lower layer film 2 is thinner than at other portions thereof, the growth of the oxide film is stopped earlier than the central portion between the lower layer films 2 and 2. This produces the unoxidized portion 10 at the center portion of the tantalum film 7.

Next, as shown in FIG. 58, the pattern of the resist 6b having a larger pattern dimension than that of the lower layer film 2 is formed on the insulating film 3.

Figure 59:
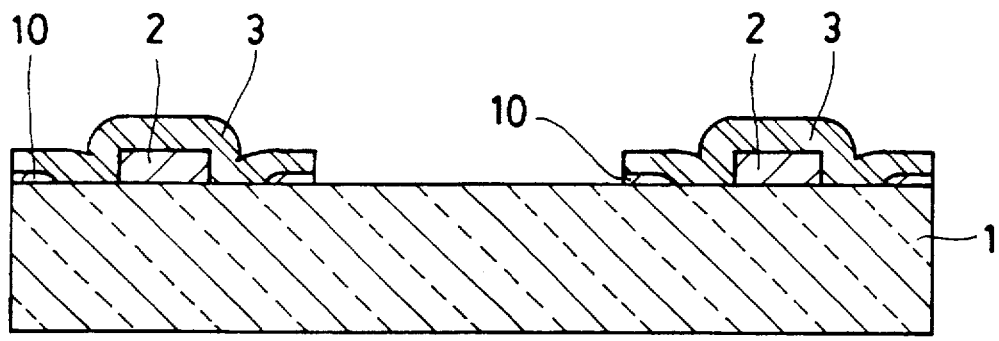

After etching the insulating film 3 using the patterned resist 6b as an etching mask with the dry etching technique, the resist 6b on the insulating film 3 is peeled off. As a result, the vertical section shown in FIG. 59 is obtained.

The dry etching processing for the insulating film 3 and the unoxidized portion 10 is carried out under the same conditions as those of the foregoing dry etching processing for the tantalum film 20.

Thereafter, the indium-tin-oxide (IT0) film 4a, which is the upper layer film material, is formed on the insulating film 3 by the sputtering technique. The pattern of the resist having the same pattern dimension as that of the upper layer film is formed on the indium-tin-oxide film 4a by the photo-lithography technique.

The pattern of the upper layer film 4 is formed by etching the indium-tin-oxide film 4a using the pattern of the resist with either the dry etching technique or the wet etching technique, and the thin film diode 8 can be completed as shown in FIG. 60.

Further, in the situation shown in FIG. 22, at the time of the etching of the tantalum film 20 which is the lower layer film, by regulating the flow rate of oxygen, the etching rate of the resist 6a to the tantalum 20 is controlled. As a result, the vertical section of the lower layer film 2 obtained by the etching process may be tapered-shaped. In this case, the finally obtained thin film diode 8 is shown in FIG. 61. The thin film diode 8 has such a structure that the upper layer film 4 is more likely to be overlapped.

| The Eighteenth Manufacturing Method |

The eighteenth manufacturing method for the thin film diode of the present invention will be described.

First, as shown in FIG. 27, the tantalum film 20 of 50 to 500 nm thickness, which is the lower layer film material, is formed on the glass substrate 1 by the sputtering technique. The pattern of the resist 6a having the pattern as that of the lower layer film is formed on the tantalum film 20 by the photo-lithography lithography technique.

Either the dry etching process or the wet etching process to etch the tantalum film 20 using the patterned resist 6a as an etching mask is performed, thereby forming the pattern of the lower layer film 2 as shown in FIG. 28.

Next, as shown in FIG. 62, the tantalum film 7, which is the insulating film material of the same material as that of the lower layer film 2, is formed on the glass substrate 1 and the pattern of the lower layer film 2 by the sputtering technique.

At the time of the formation of the film 7, if the pressure in the sputtering device is lowered, the mean free path of tantalum atoms is lengthened so that the thickness of the portion of the film 7 in the vicinity of the lower layer film 2 is thin due to the influence of the pattern. As a result, the vertical section shown in FIG. 62 can be obtained.

In the formation of the film 7, it should be noted that the thickness of the film 7 is less than half of that of the anodic oxidation film. For example, when the thickness of the anodic oxidation film is required to be 200 nm, the thickness of the tantalum film 7 should be less than 100 nm.

The insulating film 3 is formed on the lower layer film 2 by oxidizing the tantalum film 7 with the anodic oxidation technique, as shown in FIG. 49.

At this time, since the thickness of the portion of the tantalum film 7 in the vicinity of the lower layer film 2 is thinner than at other portions thereof, the growth of the oxide film is stopped earlier than the central portion between the lower layer films 2 and 2. This produces the unoxidized portion 10 at the center portion of the tantalum film 7.

Further, as shown in FIG. 50, the indium-tin-oxide (IT0) film 4a which is the upper layer film material is formed on the insulating film 3 by the sputtering technique. The pattern of the resist 6c having the same pattern dimension as that of the upper layer film is formed on the indium-tin-oxide film 4a by the photo-lithography technique.

Thereafter, as shown in FIG. 51, the pattern of the upper layer film 4 is formed by etching the indium tin oxide film 4a using the pattern of the resist 6c as an etching mask with either the dry etching technique or the wet etching technique.

Subsequently, the thin film diode 8 is completed by etching the insulating film 3 using the pattern of the upper layer film 4 as an etching mask with the dry etching technique, as shown in FIG. 52.

The etching of the insulating film 3 may be performed after peeling off the resist 6c used for the formation of the pattern of the upper layer film 4, or, it may be performed prior to peeling off the resist 6c.

Further, in the situation shown in FIG. 27, at the time of the etching of the tantalum film 20 which is the lower layer film, by regulating the flow rate of oxygen, the etching rate of the resist 6a to the tantalum 20 is controlled. As a result, the vertical section of the lower layer film 2 obtained by etching process may be tapered-shaped. In this case, the finally obtained thin film diode 8 is shown in FIG. 53. The thin film diode 8 has such a structure that the upper layer film 4 is more likely to be overlapped.

[ The Nineteenth Manufacturing Method ]

The nineteenth manufacturing method for the thin film diode of the present invention will be described.

The pattern of the upper layer film and the insulating film 3 are formed on the glass substrate 1 using any of the above described manufacturing methods as shown in FIG. 49.

Subsequently, the indium-tin-oxide (ITO) film 4a which is an upper layer film material is formed on the insulating film 3 by the sputtering technique as shown in FIG. 50. The pattern of the resist 6c having the same pattern dimension as that of the upper layer film is formed on the indium-tin-oxide film 4a by the photo-lithography technique.

As shown in FIG. 51, the pattern of the upper layer film 4 is formed by etching the indium tin oxide film 4a using the pattern of the resist 6c as an etching mask with either the dry etching technique or the wet etching technique.

Further, the resist 6c on the pattern of the upper layer film 4 is peeled off, and as shown in FIG. 54, the pattern of the resist 6d, having the larger pattern dimension than that of the upper layer film 4, is formed.

Figure 55:
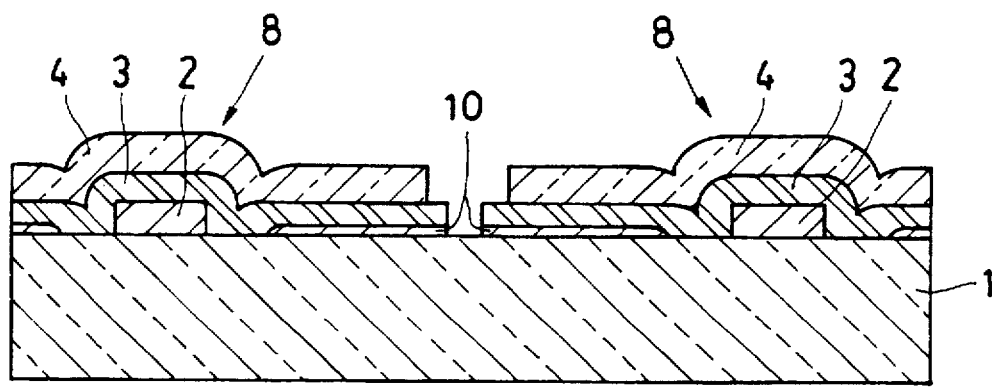

Thereafter, using the resist 6d as an etching mask, the insulating film 3 is etched by the dry etching technique. The resist 6d is peeled off from the insulating film 3 so that the thin film diode 8 can be completed as shown in FIG. 55.

[ The Twentieth Manufacturing Method ]

The twentieth manufacturing method for the thin film diode of the present invention will be described.

Also in this case, the pattern of the lower layer film 2 and the insulating film 3 are formed on the glass substrate 1 using any of the foregoing manufacturing methods as shown in FIG. 49.

Subsequently, as shown in FIG. 50, the indium tin oxide film 4a which is a upper layer film material is formed on the insulating film 3 by the sputtering technique. The pattern of the resist 6c having the same pattern dimension as that of the upper layer film is formed on the indium tin oxide film 4a by the photo-lithography technique.

Then, the pattern of the upper layer film 4 is formed by etching the indium tin oxide film 4a using the pattern of the resist 6c as an etching mask with either the dry etching technique or the wet etching technique as shown in FIG. 51.

Further, the resist 6c on the upper layer film is peeled off. The pattern of the protection film 5 having the larger pattern dimension than that of the upper layer film 4 as shown in FIG. 56.

Next, the insulating film 3 is etched using the pattern of the protection film 5 as an etching mask by the dry etching technique, thereby completing the manufacture of the thin film diode 8 as shown in FIG. 57.

[ The Twenty-first Manufacturing Method ]

The twenty-first manufacturing method for the thin film diode of the present invention will be described.

In this manufacturing method of the present invention, first, as shown in FIG. 22, the tantalum film 20 of 50 to 500 nm thickness which is a lower layer material is formed on the glass substrate 1 by the sputtering technique. Then, the pattern of the resist 6a having the same pattern dimension as that of the lower layer film is formed on the tantalum film 20 by the photo-lithography technique.

Subsequently, either the dry etching process or the wet etching process for the tantalum film 20 which is the lower layer film material is performed using the patterned resist 6a as an etching mask. Thus, the pattern of the lower layer film 2 is formed as shown in FIG. 28.

Thereafter, as shown in FIG. 63, the tantalum film 7 which is the same insulating film material as that of the lower layer film 2 is formed on the glass substrate 1 and the pattern of the lower layer film 2 by the sputtering technique.

At the time of the formation of the film 7, if the pressure in the sputtering device is lowered, the mean free path of tantalum atoms is lengthened so that the thickness of the portion of the film 7 in the vicinity of the lower layer film 2 is thin due to the influence of the pattern. As a result, the vertical section shown in FIG. 63 can be obtained.

In the formation of the film 7, it should be noted that the thickness of the film 7 is less than half of that of the anodic oxidation film. For example, when the thickness of the anodic oxidation film is required to be 200 nm, the thickness of the tantalum film 7 should be less than 100 nm.

Thereafter, the resist 6a on the pattern of the lower layer film 2 and the tantalum film 7 are peeled off. As shown in FIG. 49, the surfaces of the lower layer film 2 and the tantalum film 7 are oxidized by the anodic oxidation technique, thereby forming the insulating film 3 on the entire surface of the resultant structure.

As shown in FIG. 50, the indium tin oxide film 4a which is a upper layer film material is formed on the insulating film 3 by the sputtering technique. Then, the pattern of the resist 6c having the same pattern dimension as that of the upper layer film is formed on the indium tin oxide film 4a by the photo-lithography technique.

Further, as shown in FIG. 51, the indium tin oxide film 4a is etched using the pattern of the resist 6c as an etching mask by either the dry etching technique or the wet etching technique, thereby forming the pattern of the upper layer film 4.

Finally, the thin film diode 8 can be obtained by etching the insulating film 3 using the pattern of the upper layer film 4 as an etching mask with the dry etching technique as shown in FIG. 52.

Etching of the insulating film 3 may be performed after peeling off the resist 6c used for the formation of the upper layer film 4, or it may be performed prior to the peeling off the resist 6c.

[ The Twenty-second Manufacturing Method ]

The twenty-second manufacturing method for the thin film diode of the present invention will be described.

Also in this case, the pattern of the lower layer film 2 and the insulating film 3 are formed on the glass substrate 1 using any of the foregoing manufacturing methods as shown in FIG. 49.

Subsequently, as shown in FIG. 50, the indium tin oxide film 4a which is a upper layer film material is formed on the insulating film 3 by the sputtering technique. Thereafter, the pattern of the resist 6c having the same pattern dimension as that of the upper layer film is formed on the indium tin oxide film 4a by the photo-lithography technique.

Then, the pattern of the upper layer film 4 is formed by etching the indium tin oxide film 4a using the pattern of the resist 6c as an etching mask with either the dry etching technique or the wet etching technique as shown in FIG. 51.

Further, the resist 6c on the pattern of the upper layer film 4 is peeled off. The pattern of the resist 6d having the larger pattern dimension than that of the pattern of the upper layer film 4 is formed as shown in FIG. 54.

Finally, the insulating film 3 is etched using the pattern of the resist 6d as an etching mask by the dry etching technique, thereby completing the manufacture of the thin film diode 8 free from the breaking of the upper layer film 4 as shown in FIG. 55.

In the manufacturing method including the step for forming an insulating film material on the pattern of a lower layer film among various kinds of manufacturing methods for manufacturing a thin film diode of the present invention, a material which is available for forming the insulating film by an anodic oxidation process may be used. Therefore, such material, for example, aluminum (Al) film instead of a tantalum film used in each of the foregoing manufacturing methods may be adopted as the insulating film material.

In this case, an etching process for the aluminum film is performed using a solution in which phosphoric acid, hydrochloric acid, acetic acid, and water are blended in a 5:1:2:3 ratio.

As is apparent from the above description, according to the manufacturing methods of the thin film diode incorporated in the liquid crystal display device of the present invention, in each of the manufacturing methods an upper layer film is easily over-lapped with the lower layer film, and quality differences between the element region of the thin film diode and the vicinity thereof are not present. Therefore, the defective elements due to breakage of the step portion are greatly decreased so that the display quality of the liquid crystal display device can be remarkably enhanced.

Further, according to the manufacturing method including the step for reducing the pattern dimension of the resist by an ashing process at the time of patterning the lower layer film, the pattern dimension of the thin film diode can be reduced smaller than that of the pattern formed by a photo-lithography technique. Therefore, miniaturization of the thin film diode (active element) which can not achieved by the photo-lithography technique is possible.

What is claimed is:

1. In a manufacturing method for a thin film diode of a liquid crystal display device which comprises, two glass substrates (1, 11) with liquid crystal material sealed therebetween, a lower layer film (2) connected to a data line (12), formed on an inner surface of glass substrate (1); an insulating film (3) on the lower layer film (2), made of an insulating oxide-film formed by an anodic oxidation technique; and an upper layer film (4) constituting a portion of a drive electrode (13), formed on the insulating film (3).

the manufacturing method comprising the steps of:

forming a film of a lower layer material (20) on said glass substrate (1);

forming a pattern of a resist (6) on the lower layer material (20) by a photo-lithography technique;

etching said lower layer film material (20) using the pattern of the resist (6) as an etching mask by an etching technique to form a patterned lower layer film (2);

reducing a pattern dimension of said resist (6);

etching the exposed portion of said lower layer film (2) using said resist (6) as an etching mask until the thickness of said patterned lower layer film (2) is reduced to a preselected value to form a patterned lower layer film (2) having a difference in level in a direction of said upper layer film (4); and forming said insulating film (3) on the surface of said patterned lower layer film (2) by an anodic oxidation technique, and forming said upper layer film (4) on said insulating film (3).

2. The manufacturing method for the thin film diode of the liquid crystal display device according to claim 1, wherein after the formation of said patterned lower layer film (2), the pattern dimension of said resist (6) is reduced by an ashing processing.

3. The manufacturing method for the thin film diode of the liquid crystal display device according to claim 1, wherein after the formation of said patterned lower layer film (2), said resist (6) is peeled off, and a resist having a smaller pattern dimension than that of said resist (6) is formed on the pattern of said lower layer film (2), thereby reducing the pattern dimension of the resist.

4. In a manufacturing method for a thin film diode of a liquid crystal display device which comprises two glass substrates (1, 11) with liquid crystal material sealed therebetween, a lower layer film (2) connected to a data line (12), formed on an inner surface of a glass substrate (1); an insulating film (3) on the lower layer film (2), made of an insulating oxide film formed by an anodic oxidation technique; and an upper layer film (4) constituting a portion of a drive electrode (13), formed on the insulating film (3).

the manufacturing method comprising the steps of:

forming a film of a lower layer material (20) on said glass substrate (1);

forming a pattern of a resist (6) on the lower layer material (20) by a photo-lithography technique;

etching said lower layer film material (20) using the pattern of the resist (6) as an etching mask until the thickness of the film (20) is reduced to a preselected value greater than zero;

changing a pattern dimension of the resist (6);

etching said lower layer film material (20) using the pattern of the resist (6), whose pattern dimension was changed, as an etching mask to form a lower layer film (2) having a difference in level in a direction of said upper layer film (4); and forming said insulating film (3) on the surface of said lower layer film (2) by an anodic oxidation technique, and forming said upper layer film (4) on said insulating film (3).

5. The manufacturing method for the thin film diode of the liquid crystal display device according to claim 4, wherein said lower layer film material (20) is etched until the thickness of the lower layer film material (20) is reduced to a preselected value greater than zero, and a pattern dimension of said resist (6) is reduced by an ashing process.

6. The manufacturing method for the thin film diode of the liquid crystal display device according to claim 4, wherein an etching process for etching said lower layer film material (20) proceeds in the direction of the film thickness and is stopped when the preselected value of the thickness greater than zero of said lower layer film material (20) has been reached, said resist (6) is peeled off, and a resist having a smaller pattern dimension than that of said resist (6) is formed on said lower layer film material (20), thereby reducing the pattern dimension of the resist.

7. The manufacturing method for the thin film diode of the liquid crystal display device according to claim 4, wherein an etching process for etching said lower layer film material (20) proceeds in the direction of the film thickness and is stopped when the preselected value of the thickness greater than zero of said lower layer film material (20) has been reached, said resist (6) is peeled off, and a resist having a larger pattern dimension than that of said resist (6) is formed on said lower layer film material (20), thereby enlarging the pattern dimension of the resist.

8. In a manufacturing method for a thin film diode of a liquid crystal display device which comprises two glass substrates (1,11) with liquid crystal material sealed therebetween, a lower layer film (2) connected to a data line (12), formed on an inner surface of glass substrate (1); an insulating film (3) on the lower layer film (2), made of an insulating oxide film formed by an anodic oxidation technique; and an upper layer film (4) constituting a portion of a drive electrode (13), formed on the insulating film (3), the manufacturing method comprising the steps of:

forming a film of a lower layer material (20) on said glass substrate (1);

forming a pattern of a resist (6) on the lower layer material (20) by a photo-lithography technique;

etching said lower layer film material (20) using the pattern of the resist (6) as an etching mask until the thickness of the film (20) is reduced to a preselected value greater than zero;

peeling off said resist (6);

forming said insulating film (3) by oxidizing said lower layer film material (20) with an anodic oxidation technique to form patterned lower layer film (2); and forming said upper layer film (4) on the insulating film (3).

9. In a manufacturing method for a thin film diode of a liquid crystal display device which comprises two glass substrates (1,11) with liquid crystal material sealed therebetween, a lower layer film (2) connected to a data line (12), formed on an inner surface of glass substrate (1); an insulating film (3) on the lower layer film (2), made of an insulating oxide film formed by an anodic oxidation technique; and an upper layer film (4) constituting a portion of a drive electrode (13), formed on the insulating film (3), the manufacturing method comprising the steps of:

forming a film of a lower layer material (20) on said glass substrate (1);

forming a pattern of a resist (6) on the lower layer material (20) by a photo-lithography technique;

etching said lower layer film material (20) using the pattern of the resist (6) as an etching mask until the thickness of the film (20) is reduced to a preselected value greater than zero;

peeling off said resist (6);

forming said insulating film (3) and an unoxidized portion (10) by oxidizing said lower layer film material (20) with an anodic oxidation technique to form patterned lower layer film (2), wherein an upper portion of lower layer film material (20) forms insulating film (3) and a lower portion of lower layer film material (20) forms unoxidized portion (10); and forming said upper layer film (4) on the insulating film (3), patterning the upper film layer (4) to partially expose film (3), and etching said insulating film (3) and said unoxidized portion (10).

10. The manufacturing method for the thin film diode of the liquid crystal display device according to claim 9, wherein the pattern of said upper layer film (4) is formed on said insulating film (3); and said insulating film (3) and said unoxidized portion (10) are subjected to an etching process using the pattern of said upper layer film (4) as an etching mask.

11. The manufacturing method for the thin film diode of the liquid crystal display device according to claim 9, wherein the pattern of said upper layer film (4) is formed on said insulating film (3); the pattern of a resist (6d) having a larger pattern dimension than that of said upper layer film (4) is formed on the pattern of the upper layer film (4); and said insulating film (3) and said unoxidized portion (10) are subjected to an etching process using the pattern of the resist (6d) as an etching mask.

12. The manufacturing method for the thin film diode of the liquid crystal display device according to claim 9, wherein the pattern of said upper layer film (4) is formed on said insulating film (3); a pattern of a protection film (5) is formed on the pattern of the upper layer film (4); and said insulating film (3) and said unoxidized portion (10) are subjected to an etching processing using the pattern of the protecting film (5) as an etching mask.

13. The manufacturing method for the thin film diode of the liquid crystal display device according to claim 9, wherein a resist (6b) having a larger pattern dimension than that of said peeled off resist is formed on said insulating film (3) situated on said lower layer film (2); said insulating film (3) and said unoxidized portion (10) are etched using said resist (6b) as an etching mask; and said upper layer film (4) is formed on the insulating film (3) subjected to the etching processing.

* * * * *